United States Patent [19]

Hoshino et al.

[11] Patent Number: 5,436,116
[45] Date of Patent: Jul. 25, 1995

[54] SILVER HALIDE COLOR PHOTOGRAPHIC PHOTOSENSITIVE MATERIAL AND COLOR PROOF PREPARATION PROCESS

[75] Inventors: Keiichi Hoshino; Susumu Ohkawachi; Yasuo Tosaka; Yoshiyuki Nonaka, all of Odawara, Japan

[73] Assignee: Konica Corporation, Tokyo, Japan

[21] Appl. No.: 117,859

[22] Filed: Sep. 7, 1993

[30] Foreign Application Priority Data

Sep. 16, 1992 [JP] Japan ................................. 4-246871

[51] Int. Cl.⁶ .......................... G03C 7/30; G03C 1/46
[52] U.S. Cl. .................................. 430/358; 430/364; 430/378; 430/505; 430/556; 430/557; 430/558; 430/598; 430/611; 430/614
[58] Field of Search ............... 430/358, 378, 505, 517, 430/556, 557, 558, 598, 611, 614, 364

[56] References Cited

U.S. PATENT DOCUMENTS 4,994,350  2/1991  Ogawa et al. ..................... 430/358
5,006,454  4/1991  Sasaki .............................. 430/546

FOREIGN PATENT DOCUMENTS 0459331  12/1991  European Pat. Off. .
2172118   9/1986  United Kingdom .

*Primary Examiner*—Janet C. Baxter
*Attorney, Agent, or Firm*—Frishauf, Holtz, Goodman & Woodward

[57] ABSTRACT

Disclosed is a silver halide color photographic light-sensitive material comprising a support having thereon a mainly yellow image forming layer, a mainly magenta image forming layer and a mainly cyan image forming layer; wherein, when an exposure is conducted within 1/10 to 10 times of an exposure amount giving minimum density of +0.2 on the first layer selected from said three layers after developing in the main spectra sensitivity region of the first layer, the second layer selected from said three layers is given lower density with said 1/10 to 10 times of exposure than a density without said 1/10 to 10 times of exposure; and reflection densities in 450 nm, 550 nm and 700 nm is not less than 0.8 respectively, before the developing.

The silver halide color photographic light sensitive material is capable of providing a color proof improved in the approximation degrees of an image quality to a printed printer.

18 Claims, No Drawings

SILVER HALIDE COLOR PHOTOGRAPHIC PHOTOSENSITIVE MATERIAL AND COLOR PROOF PREPARATION PROCESS

FIELD OF THE INVENTION

This invention relates to a silver halide color photographic light sensitive material suitable for forming a proof-reading color image (or, a color proof) from a plurality of black-and-white half dot images prepared by a color-separation and a half dot image conversion in a color plate-making.printing process; and the invention also relates to a positive type color light sensitive material suitable for preparing a color proof.

BACKGROUND OF THE INVENTION

There have so far been well-known processes for forming a color proof from a plurality of black-and-white half dot images prepared by a color-separation and a half dot image conversion in a color plate-making.printing process, such as an over-lay process in which a color image is formed by making use of a photopolymer or a diazo compound, and a surprint process.

The over-lay process has such an advantage that the operations are very simple and the production cost is inexpensive and, in addition, the process can also be utilized for proofing only by superposing four color film sheets (in the primary colors of subtractive color mixture and black). However, this process has such a disadvantage that a gloss is produced by superposing the film sheets and, therefore, the resulting texture is different than the texture of printed matter.

The surprint process involves superposing colored images on a support. This type of process includes the well-known processes described in, for example, U.S. Pat. Nos. 3,582,327, 3,607,264 and 3,620,726, in which a colored image is obtained by utilizing the stickiness of a photopolymeric materials and a toner development.

There are also the well-known processes as described in Japanese Patent Examined Publication No. 47-27441/1972 and Japanese Patent Publication Open to Public Inspection (hereinafter abbreviated to JP OPI Publication) No. 56-501217/1981, in which a color proof is prepared in the following manner. An image is formed by transferring it onto a support by making use of a light-sensitive colored sheet, by exposing it to light and then by developing it. After that, another colored sheet is laminated thereon and then the same procedures are repeated so as to prepare the color proof.

There is also a well-known process as described in JP OPI Publication No. 59-97140/1084, in which colored images are obtained by making use of a light-sensitive colored sheet and the corresponding color-separation films are each exposed to light and developed, and the resulting colored images are each transferred onto a support so that a color proof can be formed thereon. The toners for forming the above-mentioned images and the colorants for colored sheets have the advantage that the same coloring materials as printing inks can be used Therefore, the resulting color proof closely resembles the original in color tone.

However, these processes have the following disadvantages. In the steps for preparing a color proof, images have to be superposed and transferred and it takes a long time to complete the operations and, in addition, the production cost is also expensive.

As for the processes capable of eliminating the above-mentioned disadvantages, there are the processes in which a color proof can be prepared by making use of a silver salt color photographic light sensitive material comprising a white support, such as disclosed in JP OPI Publication Nos. 56-113139/1981, 56-104335/1981, 62-280746/1987, 62-280747/1987, 62-280748/1987, 62-280749/1987, 62-280750/1987 and 62-280849/1987.

In these processes, a proofing image is used in the form of a color image that is formed in the following manner. Plural color-separated black-and-white halftone dot images are prepared by converting a colored original document into plural color-separated halftone dot images. The resulting plural B&W halftone dot images are printed one after another on one sheet of color paper in a contact printing method or the like. The printed images are color developed so that a color image is formed of the dyes produced imagewise by the couplers. The resulting color image is to be used as the proofing image.

The above-mentioned technique, however, has the following defects. When the color image is adjusted to approximate the color of printed matter, the density of the black image such as the density of letters is inferior to that of the printed matter and, on the other hand, when means are taken for enhancing the density to try to approximate the density of the black image such as that of letters to the density of the printed matter, the approximation to color image of the printed matter deteriorates. Therefore, it is difficult to produce a proof image where both the color image and the black image are simultaneously a good approximation to printed images.

As for the techniques capable of improving the above-mentioned disadvantages, there have so far been the well-known techniques of adding the 4th layer that is a black printer layer having a spectral sensitivity different from any other yellow, magenta and cyan color developing layers. Besides these techniques, Japanese Patent Publication Open to Public Inspection (hereinafter referred to as JP OPI Publication) Nos. 2-289846/1990 and 2-183251/1990, and so forth also disclose the techniques for improving the above-mentioned disadvantages. However, any satisfactory effects have not been enjoyed from these techniques.

Each of the techniques mentioned above have the serious problems of the practical application that the productivity is reduced due to the increase of the numbers of exposures. Accordingly, there have been demands for further improvements.

Further, when a color image is made approximate to a printed matter by making use of a silver salt color photosensitive material, there is such a serious problem as the deterioration of image sharpness (that is a halftone dot reproducibility). When a color image is used as a color proof, the above-mentioned image sharpness, that is a halftone dot reproducibility, is one of the definitely essential qualities.

The following methods have been well-known so far as the methods for improving the image sharpness of silver salt color photosensitive materials.

(1) A method of making use of a water-soluble dye for preventing any irradiation production;

(2) Another method of increasing the filling concentration of the white pigment contained in a polyolefin layer coated on a reflection type support laminated with polyolefin on the base paper thereof;

(3) A further method of thinning a photographic component layer containing hydrophilic colloid; and (4) Still further method of including, in a photographic component layer, a compound capable of releasing a development inhibiting compound when the layer is developed.

The above-mentioned method (1) is applied to any commonly marketed color photosensitive materials for printing use. In this method, however, the water-soluble dye content is low and the reflection densities in the wavelengths of 450 nm, 500 nm and 700 nm are each less than 0.5, before the subject color photosensitive material is developed. Therefore, any color proof having both satisfactory image sharpness and fidelity cannot be prepared.

About the method (2), JP OPI Publication Nos. 61-284763/1986, 61-27049/1986, 61-270750/1986 and so forth described thereof. Still in this method, however, any image satisfiable for a color proof cannot be prepared.

In the method (3), there is a limitation to make a photographic component layer thinner. Therefore, any satisfiable effects cannot be obtained.

In the method (4), any image satisfiable for a color proof cannot be prepared, although an edge effect may be emphasized in low spatial frequencies.

SUMMARY OF THE INVENTION

It is, therefore, an object of the invention to provide a color proof improved in the approximation between a printed matter and the image qualities of the color proof (such as a hue and a halftone dot reproducibility), without spoiling any operabilities, when the color proof is prepared of the halftone dot image information obtained by making a color-separation and a halftone dot image conversion, using a silver halide color photographic photosensitive material.

DETAILED DESCRIPTION OF THE PREFERRED EMBODIMENT

The above-mentioned object of the invention can be achieved in the following constitution.

(1) A silver halide color photographic photosensitive material characterized in that the photosensitive material comprises a layer mainly forming a yellow image, another layer mainly forming a magenta image and a further layer mainly forming a cyan image;

that, when any two layers arbitrarily selected from the three layers are named layer 1 and layer 2 respectively, and when the photosensitive material is exposed to light in the main spectral sensitivity region of layer 1 and in an exposure quantity capable of giving a density 1/10 to 10 times as much as the minimum density +0.2 to the image density on layer 1 and developed, then, the photosensitive material has at least one combination that the image density on layer 2 is lower than the density obtained when the exposure is not made, but the development is made; and that the reflection densities in 450 nm, 550 nm and 700 nm are not less than 0.8, respectively, before the photosensitive material is not developed.

(2) A silver halide color photographic photosensitive material characterized in that the photosensitive material comprises a support bearing thereon an antihalation layer further bearing thereon a layer mainly forming a yellow image, another layer mainly forming a magenta image and a further layer mainly forming a cyan image;

that, when any two layers arbitrarily selected from the three layers are named layer 1 and layer 2 respectively, and when the photosensitive material is exposed to light in the main spectral sensitivity region of layer 1 and in an exposure quantity capable of giving a density 1/10 to 10 times as much as the minimum density +0.2 to the image density on layer 1 and developed, then, the photosensitive material has at least one combination that the image density on layer 2 is lower than the density obtained when the exposure is not made, but the development is made; and that the reflection densities in 450 nm, 550 nm and 700 nm are not less than 0.8, respectively, before the photosensitive material is not developed.

(3) A color proof preparation process comprising the step of exposing to light a silver halide color photographic photosensitive material comprising a support bearing thereon a mainly yellow image forming layer, a mainly magenta image forming layer and a mainly cyan image forming layer, according to the halftone dot image information color-separated into the yellow, magenta, cyan and black image information; wherein the silver halide color photographic photosensitive material is the silver halide color photographic photosensitive material described in paragraph 1 (above) or the material described in paragraph 1 further containing a water-soluble yellow dye, water-soluble magenta dye or water-soluble cyan dye.

In the invention a reflection density is indicated by a value obtained by measuring a subject sample through a color analyzer Model 607 manufactured by Hitachi, Ltd.

The invention will further be detailed below.

In the invention, the methods in which the reflection densities of each wavelengths of 450 nm, 500 nm and 700 nm are made to be 0.8 or higher before a subject sample is developed, such methods include, preferably, a method in which water-soluble yellow, magenta and cyan dyes are added and/or another method in which an antihalation layer is arranged to serve as the lowermost layer.

The antihalation layer is preferable to be made present in the form of a non-photosensitive hydrophilic colloidal layer. The above-mentioned water-soluble dyes and/or colloidal silver may be contained therein.

The water-soluble yellow, magenta and cyan dyes applicable to the invention include, for example, oxonol dyes, cyanine dyes, merocyanine dyes, azo dyes, anthraquinone dyes and allylidene dyes. Among them, the oxonol dyes and merocyanine dyes are particularly preferable, from the viewpoints of the high decomposing property in processing solutions and the non-color sensitizing property.

The above-mentioned oxonol dyes are described in, for example, U.S. Pat. No. 4,187,225, and JP OPI Publication Nos. 48-42826/1973, 49-5125/1974, 49-99620/1974, 50-91627/1975, 51-77327/1976, 55-120660/1980, 58-24139/1983, 58-143342/1983, 59-38742/1984, 59-111640/1984, 59-111641/1984, 59-168438/1984, 60-218641/1985, 62-31916/1987, 62-66275/1987, 62-66276/1987, 62-185755/1987, 62-273527/1987 and 63-139949/1988. The above-mentioned merocyanine dyes are described in, for example, JP OPI Publication Nos. 50-145124/1975, 58-120245/1983, 63-35437/1988, 63-35438/1988, 63-34539/1988 and 63-58437/1988.

The typical examples of the oxonol and merocyanine dyes will be given below. However, the invention shall not be limited thereto.
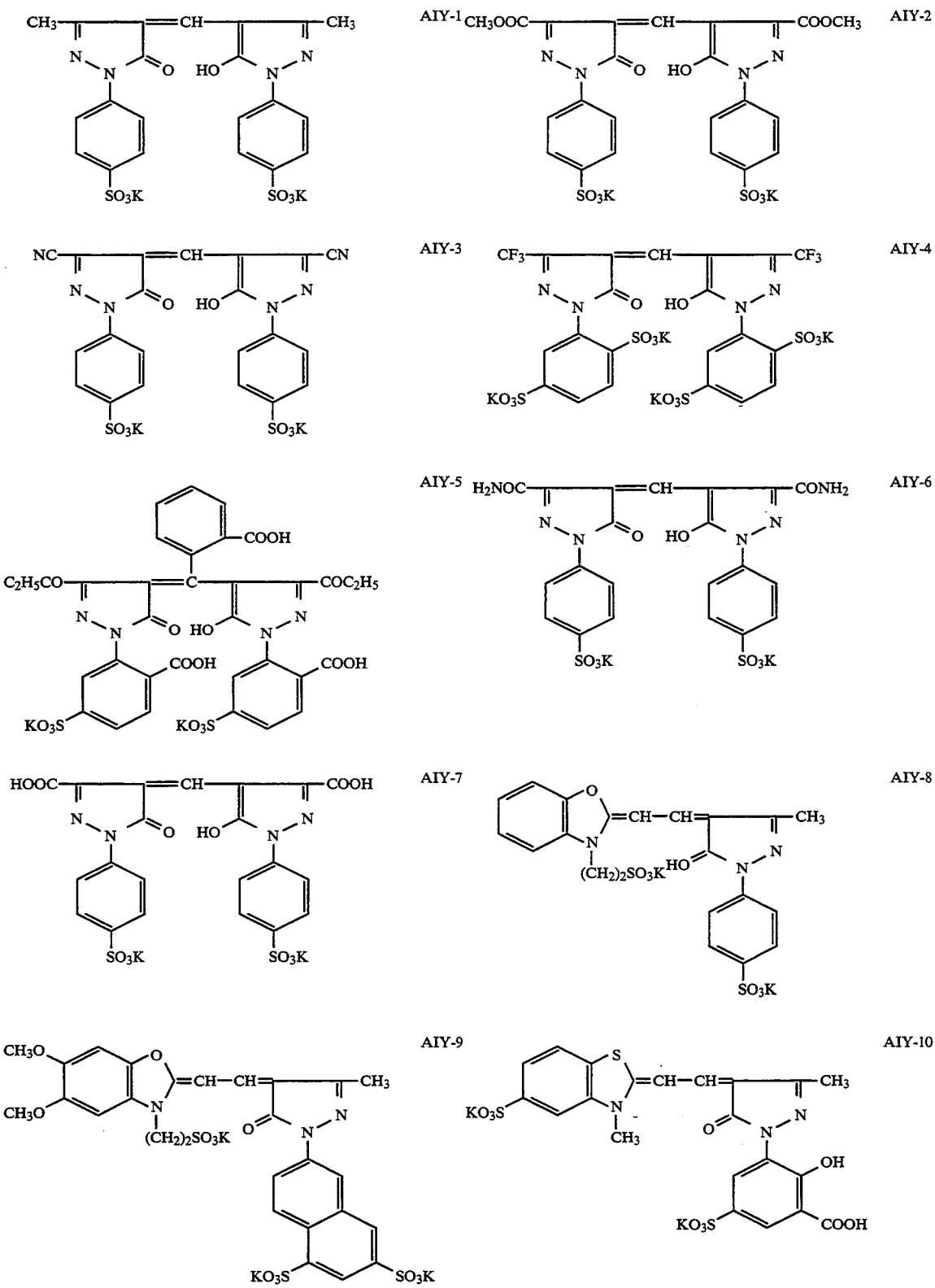

-continued
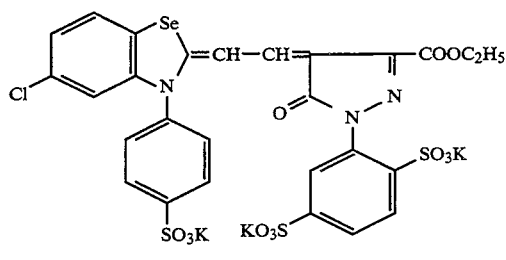 AIY-11
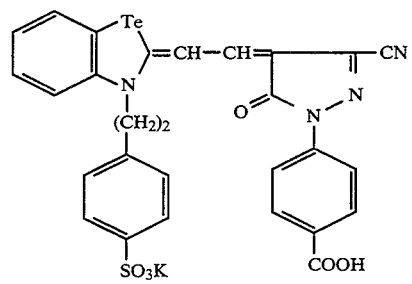 AIY-12
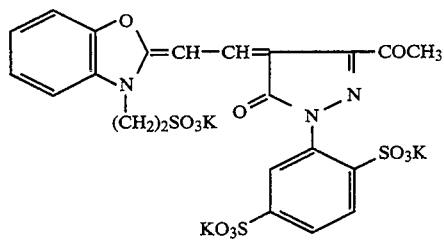 AIY-13
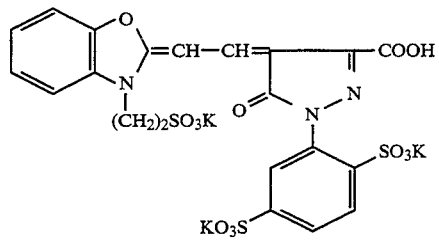 AIY-14
(Water-soluble magenta dyes)
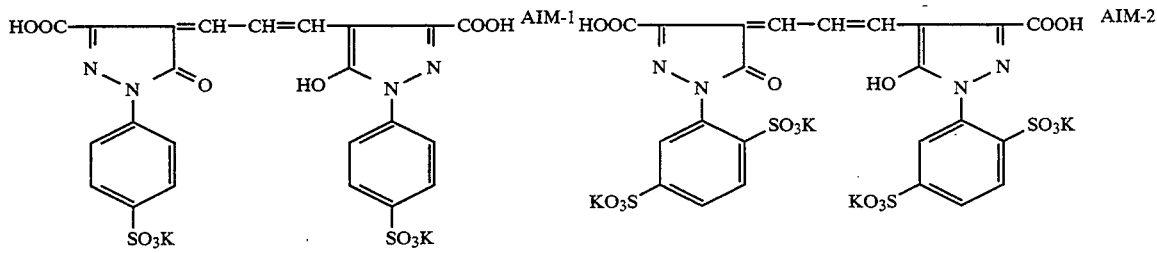
AIM-1  AIM-2
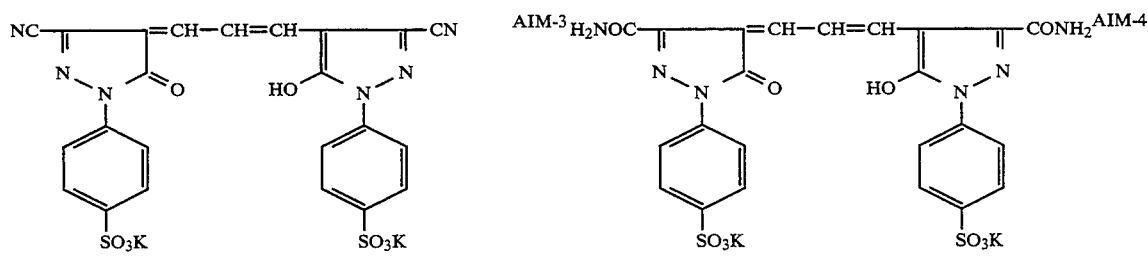
AIM-3  AIM-4
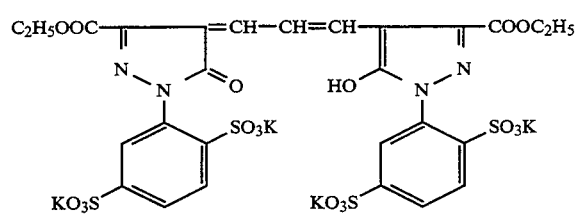 AIM-5
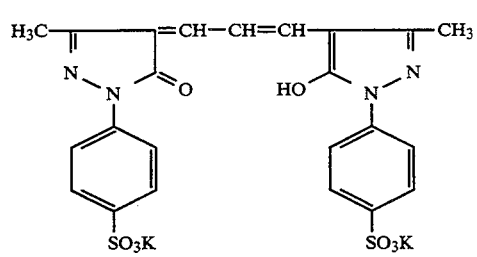 AIM-6

-continued
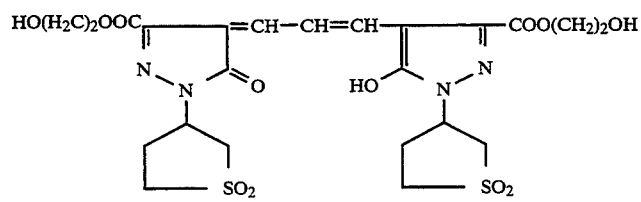
AIM-7
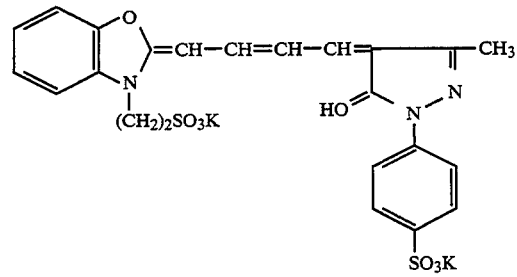
AIM-8
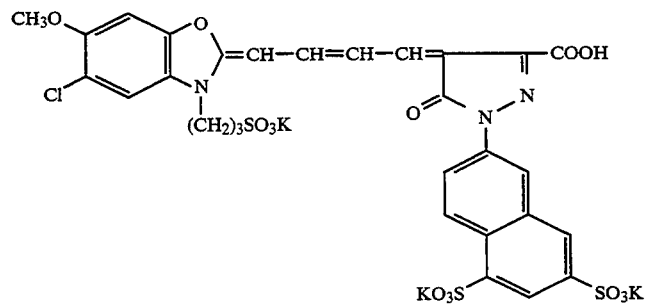
AIM-9
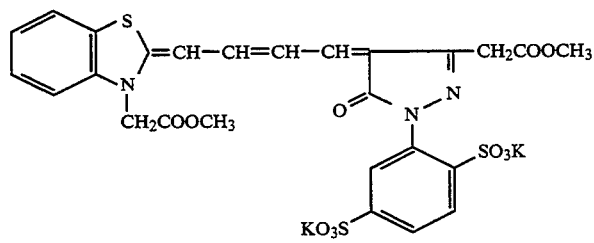
AIM-10
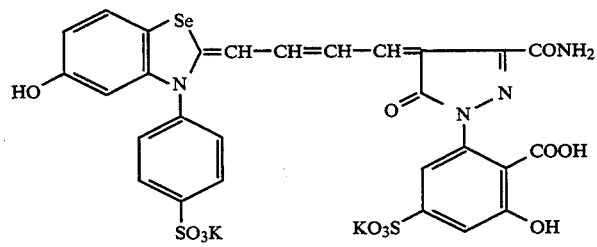
AIM-11
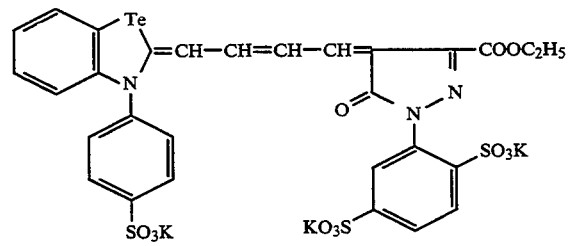
AIM-12

-continued
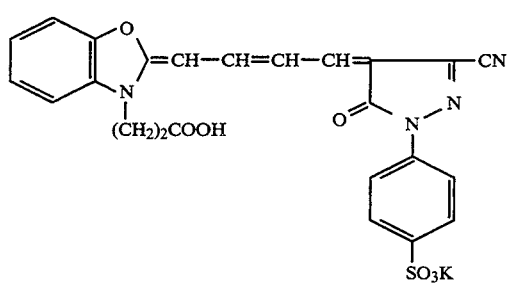
AIM-13
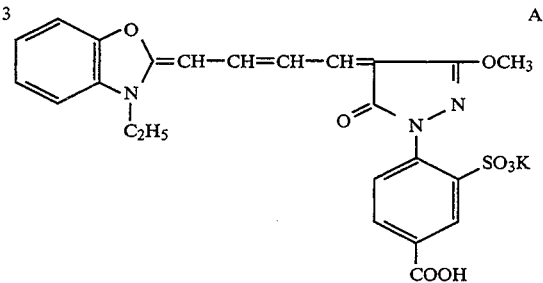
AIM-14
(Water-soluble cyan dyes)
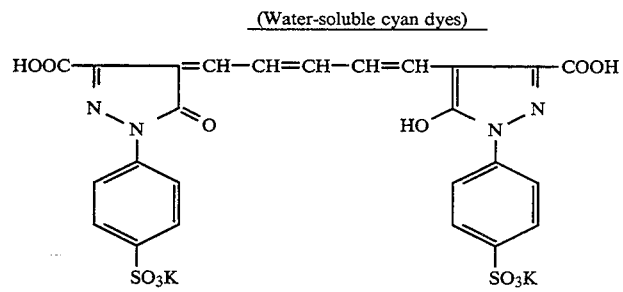
AIC-1
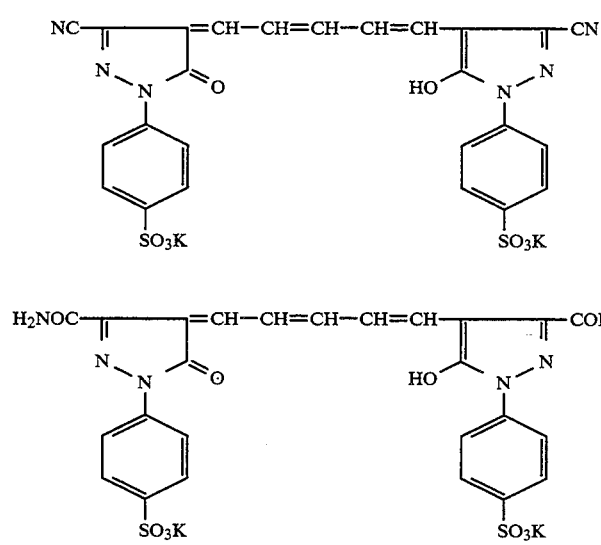
AIC-2
AIC-3
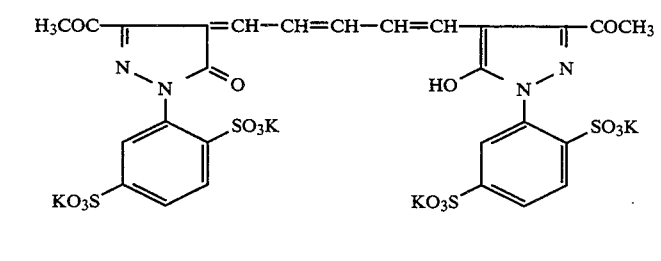
AIC-4
AIC-5

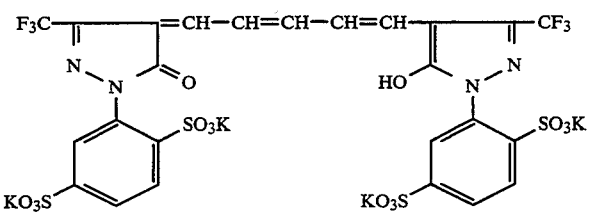
AIC-6
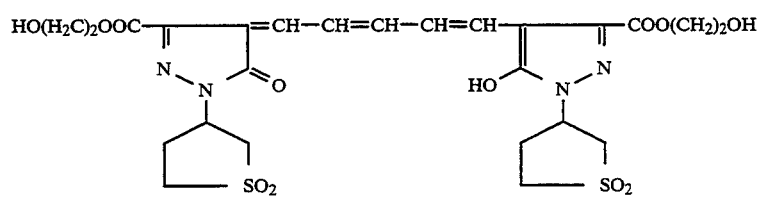
AIC-7
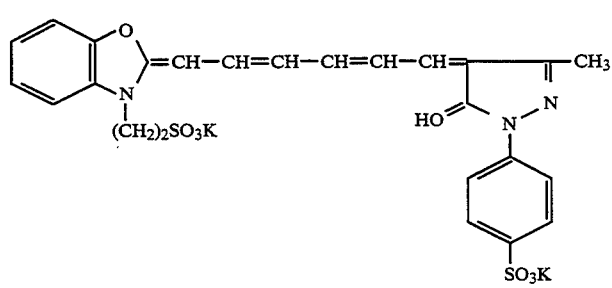
AIC-8
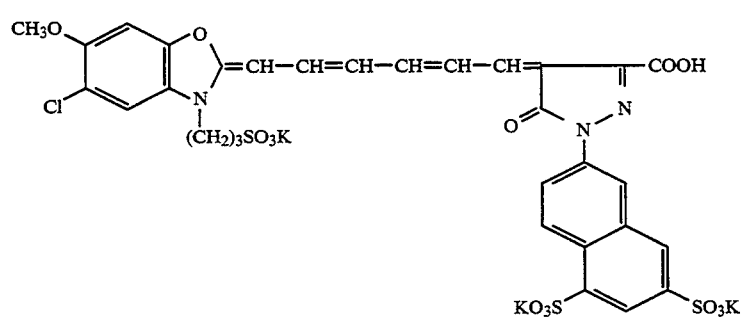
AIC-9
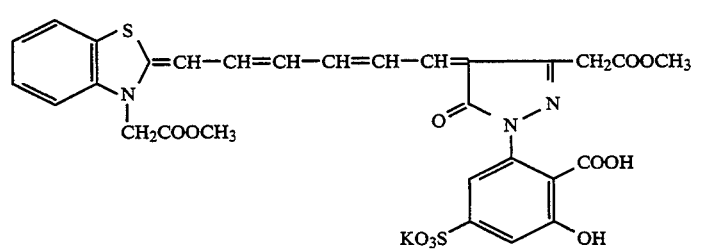
AIC-10
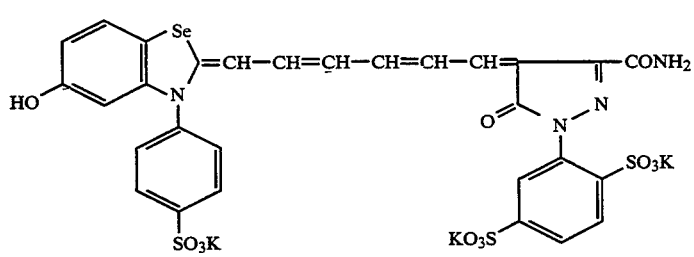
AIC-11

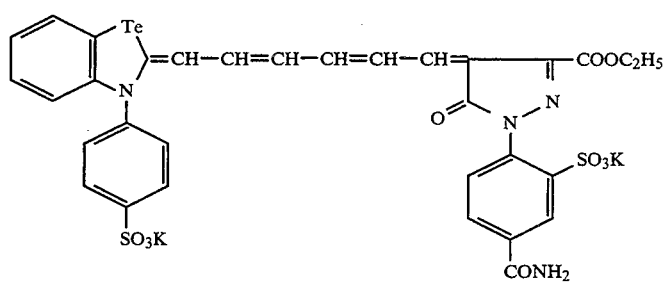
AIC-12
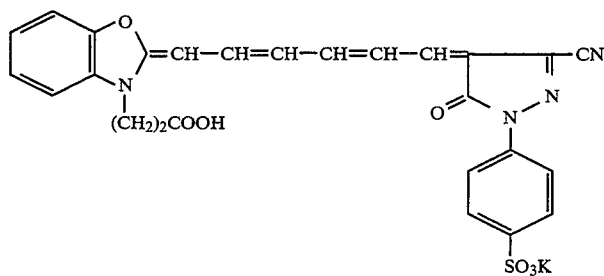
AIC-13
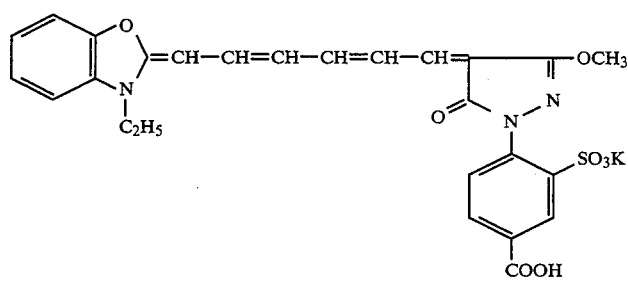
AIC-14
Now, the typical examples of the water-soluble dyes other than the oxonol and merocyanine dyes will be given below. However, the invention shall not be limited thereto.
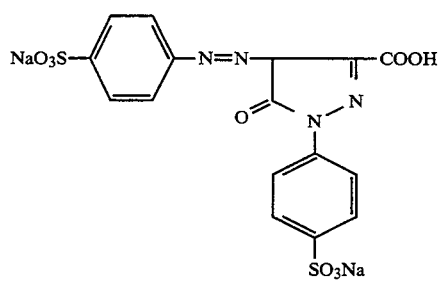
AIY-15
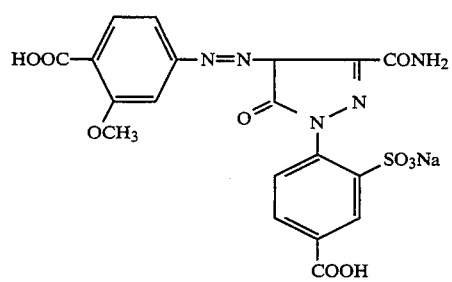
AIY-16
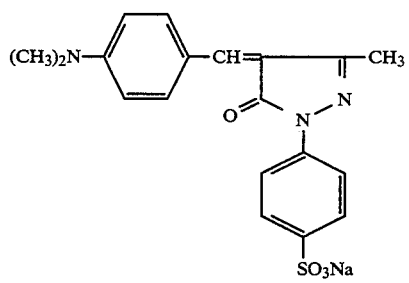
AIY-17
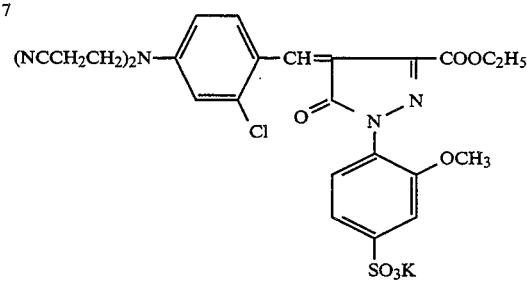
AIY-18

-continued

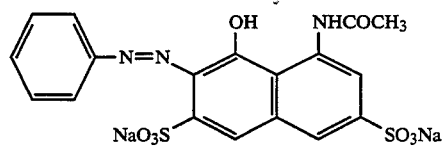
AIM-15

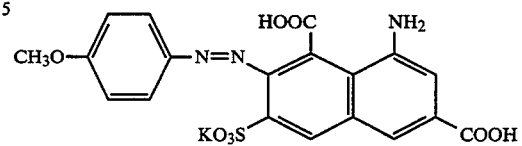
AIM-16

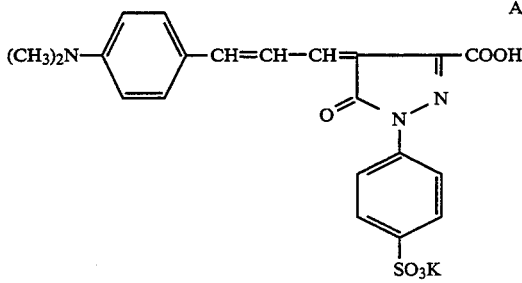
AIM-17

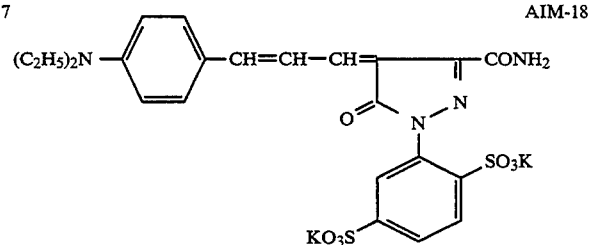
AIM-18

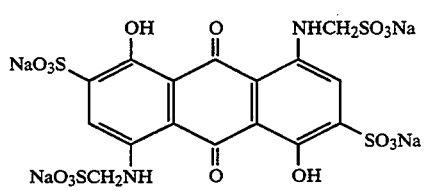
AIC-15

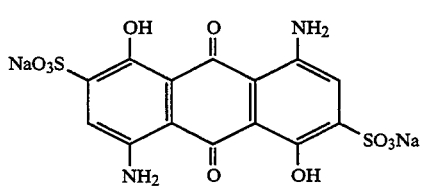
AIC-16

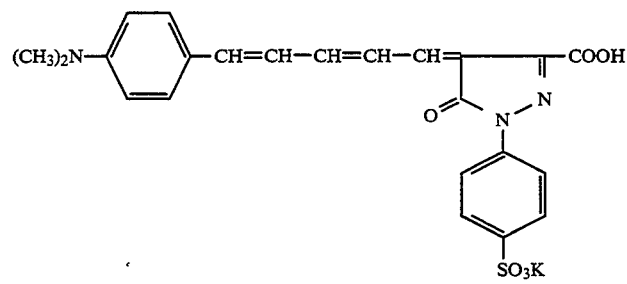
AIC-17

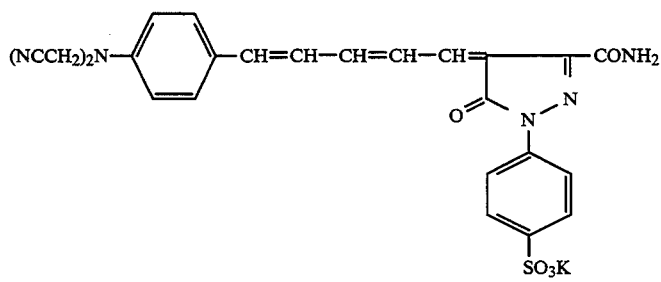
AIC-18

In the invention, the water-soluble dyes are used in an amount necessary to make the reflection densities not less than 0.8 in each wavelength of 450 nm, 550 nm and 700 nm, before developing the subject photosensitive material. The preferable reflection densities are each within the range of 0.9 to 1.2.

In the invention, the water-soluble dyes are contained in photosensitive silver halide emulsion layers and/or non-photosensitive layers.

The water-soluble dyes of the invention are used in the combination of water-soluble yellow, magenta and cyan dyes. Each of the water-soluble yellow, magenta and cyan dyes are used independently or in combination.

In the invention, the antihalation layer, that is the lowermost layer, contains a compound capable of absorbing the rays of light. As for these compounds, a variety of organic and inorganic compounds having such a function as mentioned above may be used.

Among them, the inorganic compounds are preferably used.

As for the above-mentioned inorganic compounds, colloidal silver and colloidal manganese are suitably used. Among them, colloidal silver is particularly preferable. These colloidal metals are also effective when they are applied to the color photosensitive materials of the invention, because they have an excellent decoloring property. The above-mentioned colloidal silver such as gray colloidal silver can be obtained in the following manner. Silver nitrate is reduced in gelatin, while keeping the alkalinity, in the presence of a reducing agent such as hydroquinone, phenidone, ascorbic acid, pyrogallol or dextrin. After the resulting reduced matter is neutralized and cooled down so that gelatin is set, the reducing agent and needless salts are removed in a noodle-washing method. A uniformly granulated colloidal silver dispersion solution can be prepared by producing the colloidal silver grains in the presence of an azaindene or mercapto compound, when the above-mentioned reduction is carried out in an alkaline condition.

The colloidal silver adding weight is not more than 0.13 g/m² and, preferably, not more than 0.07 g/m², in terms of the silver content thereof.

These dye compounds have each a hydrophilic group that is substantially water-soluble (against water having a pH 7 or lower) and is dissociated at pH 9 or higher. These compounds may be contained in any photosensitive emulsion layers and non-photosensitive hydrophilic colloidal layers among the photographic component layers in the following manner. These compounds are prepared, by making them present in gelatin or a high polymer binder, to be a fine-grained, solid and dispersed matter (that is in the form of the flocks of the grains having some microscopic dimension such as an average grain size of, preferably, 10 μm or smaller and, particularly, 1 μm or smaller) each obtained in a method for finely granulating the compounds by making use of a ball-mill or a sand-mill or in another method for dissolving the compounds in an organic solvent and dispersing them into a gelatin solution.

The above-mentioned fine-grained, solid and dispersed matters are made present water-solubly and stably in a color photographic photosensitive material. However, most of the matters disappear from the above-mentioned color photographic photosensitive material, because the hydrophilic groups contained in the dye compounds are so dissociated as to be water-soluble or decolored by making an exposure and then by processing with a color developer (preferably having a pH of not less than 9).

There is no special limitation to the layers containing the above-mentioned dyes and colloidal silver. However, the dyes and colloidal silver are preferable to be contained in a non-photosensitive hydrophilic colloidal layer arranged between a support and the layer closest to the support.

On the silver halide emulsion-coated side of the support of the photographic component layers of the color photosensitive materials of the invention, the photosensitive emulsion layers and non-photosensitive hydrophilic colloidal layers each arranged thereto contain gelatin in a total amount of not more than 13 g and, preferably, within the range of not less than 5 g and less than 12 g, per 1 m² of the photosensitive material.

The silver halides applicable to the invention can be optically sensitized by making use of any commonly applicable sensitizing dyes. It is also useful to the silver halide emulsions of the invention to make combination use of the sensitizing dyes applicable to super-color sensitizing an internal latent image forming type silver halide emulsion, a negative type silver halide emulsion and so forth. The details of the sensitizing dyes can be referred to Research Disclosure (hereinafter referred to as RD) Nos. 15162 and 17643.

The silver halide emulsions applicable to the invention may also include a silver halide emulsion capable of forming a negative image by making a development with a surface latent image forming type silver halide emulsion capable of forming a latent image on the surface upon making an imagewise exposure to light. It is further preferable to use an emulsion capable of obtaining a direct positive image in the following manner; an internal latent image forming type emulsion not fogged in advance on the grain surfaces thereof is used and, after making an imagewise exposure to light, a fogging treatment (or so-called a granulating treatment) is applied and then a surface development is carried out; or, after making an imagewise exposure to light, and a surface development is carried out while applying a fogging treatment thereto; so that the direct positive image can be obtained.

The above-mentioned fogging treatment can be performed by making an overall non-image exposure, by making use of a foggant in a chemical way, by making use of a high energy developer, by making a heat treatment, or by the like ways. The term, 'an emulsion containing internal latent image forming type silver halide emulsion grains', herein stated means those having photosensitive nuclei mainly inside the silver halide crystal grains thereof and containing silver halide grains capable of forming a latent image inside the grains upon making an exposure to light.

In the field of the above-mentioned internal latent image forming type direct positive techniques, there have been many well-known techniques so far. The well-known techniques thereof include those described in, for example, U.S. Pat. Nos. 2,592,250, 2,466,957, 2,497,875, 2,588,982, 3,761,266, 3,761,276 and 3,796,577; British Patent No. 1,151,363; and so forth.

The mechanism for forming a positive image has not been definitely apparent. However, for example, the following descriptions are found in "Photographic Science and Engineering", Vol.20, p.158, (1976).

Photoelectrons produced in silver halide crystal grains by making an imagewise exposure are captured selectively in the grains, so that an internal latent image can be formed. The resulting internal latent image can work as an effective capture center to the electrons present in a conduction band. Therefore, the electrons injected thereafter in a fogging development process are captured inside the grains exposed to light, so that the latent image can be intensified. In this case, the latent image cannot be developed in any surface development, because the latent image is made present inside the grains. On the other hand, at least one part of the electrons injected is captured on the surfaces of the grains not exposed imagewise to light, so that a latent image can be formed thereon. Therefore, the grains are developed in a surface development.

The internal latent image forming type silver halide grains unfogged in advance, which are applicable to the invention, such grains are formed into an emulsion comprising silver halide grains having most of the photosensitive nuclei inside the grains so that a latent image can mainly be formed inside the silver halide grains. These emulsions contain each any silver halides including, for example, silver bromide, silver chloride, silver chlorobromide, silver chloroiodide, silver iodobromide, silver chloroiodobromide and so forth.

Among the above-mentioned emulsions, a preferable emulsion is as follows. A part of a sample is coated on a transparent support so that the silver coating weight thereof can be within the range of about 1 to 3.5 g/m², and the part of the sample is exposed to light through a light intensity scale for a certain time from about 0.1 seconds to about 1 second. The exposed sample is then developed at 20° C. for 4 minutes with the following surface developer A capable of developing only the images formed on the surfaces of the grains not substantially containing silver halide solvent. In this case, the maximum density of the resulting developed sample is not higher than one fifth of the maximum density obtained when another part of the same emulsion sample is exposed to light in the same manner as above and is then developed at 20° C. for 4 minutes by making use of the following internal developer B capable of developing the image present inside the grains. In a particularly preferable emulsion, the maximum density obtained by making use of surface developer A is not higher than one tenth of the maximum density obtained by making use of internal developer B.

| (Surface developer A) | |
|---|---|
| Metol | 2.5 g |
| L-ascorbic acid | 10.0 g |
| Sodium metaborate (tetrahydrate) | 35.0 g |
| Potassium bromide | 1.0 g |
| Add water to make | 1000 cc |
| (Internal developer B) | |
| Metol | 2.0 g |
| Sodium sulfite (anhydrate) | 90.0 g |
| Hydroquinone | 8.0 g |
| Sodium carbonate (monohydrate) | 52.5 g |
| Potassium bromide | 5.0 g |
| Potassium iodide | 0.5 g |
| Add water to make | 1000 cc |

The internal latent image forming type silver halide emulsions preferably applicable to the invention include those prepared in various processes. For example, they include the following emulsions; namely, a conversion type silver halide emulsion such as those described in U.S. Pat. No. 2,592,250; a silver halide emulsion comprising silver halide grains treated in an internal chemical sensitization, such as those described in U.S. Pat. Nos. 3,206,316, 3,317,322 and 3,367,778; an emulsion comprising silver halide grains incorporated polyvalent metal ions thereinto, such as those described in U.S. Pat. Nos. 3,271,157, 3447,927 and 3,53,291; a silver halide emulsion chemically sensitized slightly on the surfaces of the silver halide grains containing a doping agent, such as those described in U.S. Pat. No. 3,761,276; a silver halide emulsion comprising the grains having a multilayered structure, such as those described in JP OPI Publication Nos. 50-8524/1975, 50-38525/1975 and 53-2408/1978; and, besides, a silver halide emulsion such as those described in JP OPI Publication Nos. 52-156614/1977 and 55-127549/1980.

The internal latent image forming type silver halide grains preferably applicable to the invention may be comprised of silver halides having any silver halide compositions. Among them, however, the grains containing silver chloride are excellent in developability and suitable for rapid processing treatments.

The silver halide grains applicable to the invention may have any configurations such as a cube, an octahedron, a tetradecahedron comprising the mixtures of (100) faces and (111) faces, a form having (110) faces, a sphere, and a tablature. The grains may preferably be used when they have an average grain size within the range of 0.05 to 3 μm. Concerning the grain size distribution of the grains, they may be either monodisperse type emulsion grains having a uniform crystal habit, or emulsion grains irregular in grain size or in crystal habit. Among these emulsions, the above-mentioned monodisperse type silver halide emulsions uniform in grain size and crystal habit are preferable. In the invention, the term, 'a monodisperse type silver halide emulsion', herein means an emulsion obtained when the contents by weight of the silver halide grains having the grain size within the range of ±20% of the average grain size rm are not less than 60%, preferably 70% and, particularly 80% of the total contents by weight of the silver halide grains. The term, 'an average grain size rm', is herein defined as a grain size ri obtained when maximizing the product, $ni \times ri^3$, of a frequency ni of the grains having a grain size ri and $ri^3$, (provided therein that the significant figures are three columns and the lowest column is rounded). The term, 'a grain size', herein means a grain diameter in the case of spherical silver halide grains, and a diameter obtained when the projective image of a grain is converted into a circular image having the same area as that of the projective image in the case of any grains than the spherical grains. The grain sizes can be obtained in the following manner, for example. A grain is magnified 10,000 to 50,000 times larger through an electron microscope and is then photographed, and the diameter or projected area of the grain is practically measured on the resulting photoprint, (provided therein that the numbers of the grains subject to the measurement are not less than 1,000 at random).

In the particularly preferable highly monodisperse type emulsions, the grain size distributions thereof defined by the following formula are not higher than 20%.

(Standard grain size deviation/Average grain size)×100=Grain size distribution (%)

wherein the average grain sizes and the standard grain size deviations are to be obtained from the aforementioned definition of ri.

The above-mentioned monodisperse type emulsions can be prepared by adding a water-soluble silver salt solution and a water-soluble halide solution into a gelatin containing seed grains, under the controls of pAg and pH, in a double-jet precipitation method. For determining the adding rate, the techniques described in JP OPI Publication Nos. 54-48521/1979 and 58-49938/1983 may be referred. As for the processes for preparing a further highly monodisperse type emulsion, it is allowed to apply the process for growing an emulsion in the presence of a tetrazaindene compound, which is disclosed in JP OPI Publication No. 60-122935/1985.

In the silver halide color photographic photosensitive materials of the invention, the mainly yellow image forming silver halide emulsion layer, a mainly magenta image forming silver halide emulsion layer and a mainly cyan image forming silver halide emulsion layer contain the silver halide emulsions each having the different spectrally sensitive wavelength regions, and at least one of the above-mentioned yellow, magenta and cyan image forming silver halide emulsion layers contains a silver halide emulsion having the spectral sensitivity having the common portions to each of the spectral sensitivities of the emulsions having the different spectrally sensitive wavelength regions, which are contained respectively in the above-mentioned yellow, magenta and cyan image forming silver halide emulsion layers.

In the invention, the yellow, magenta and cyan image forming layers have each the different spectral sensitivities, respectively. In the spectrally sensitive wavelength regions of each layer, it is preferable when any one of the wavelengths therein can show a sensitivity preferably at least 4 times and particularly at least 8 times as much as the spectral sensitivities of the other layers.

The descriptions will now be made about the silver halide emulsions each having the spectral sensitivities having the portions common to the spectral sensitivities of the emulsions having the different spectrally sensitive wavelength regions, which are to be contained in the above-mentioned yellow, magenta and cyan image forming silver halide emulsion layers of the invention. In this specifications and for simplifying the descriptions, among the above-mentioned silver halide emulsions each having the different spectral sensitivities, the silver halide emulsions to be contained in the yellow, magenta and cyan image forming layers are abbreviated to emulsions Y, M and C, respectively. Further, when a silver halide emulsion having the spectral sensitivity has a portion common to the spectral sensitivities of every emulsion having the different spectrally sensitive wavelength regions, which are to be contained in the yellow, magenta and cyan image forming silver halide emulsion layers, the silver halide emulsion is abbreviated to an emulsion P. In the invention, emulsion P has the spectral sensitivity having a portion common to the spectrally sensitive regions each of emulsions Y, M and C, respectively.

When making an exposure with any one of the wavelengths in the spectrally sensitive region of emulsion Y, the sensitivity ratio of emulsion Y to emulsion P is preferably within the range of 1/10 to 10. Similarly, when making an exposure with any one of the wavelengths in the spectrally sensitive region of emulsion M, the sensitivity ratio of emulsion M to emulsion P is preferably within the range of 1/10 to 10; and when making an exposure with any one of the wavelengths in the spectrally sensitive region of emulsion C, the sensitivity ratio of emulsion C to emulsion P is preferably within the range of 1/10 to 10.

In one of the preferable embodiments of the invention, the yellow image forming layer contains a blue-sensitive silver halide emulsion, the magenta image forming layer contains a green-sensitive silver halide emulsion and the cyan image forming layer contains a red-sensitive silver halide emulsion. The above-mentioned yellow image forming layer is further mixed with a silver halide emulsion photosensitive to blue, green and red light.

Similar to the above, the above-mentioned magenta and cyan image forming layers are mixed with a silver halide emulsion photosensitive to blue, green and red light.

In another preferable embodiment, the yellow image forming layer contains a green-sensitive silver halide emulsion, the magenta image forming layer contains a red-sensitive silver halide emulsion and the cyan image forming layer contains an infrared-sensitive silver halide emulsion. The above-mentioned yellow image forming layer is mixed with a silver halide emulsion photosensitive to green, red and infrared light. Similarly, the above-mentioned magenta and cyan image forming layers are each also mixed with a silver halide emulsion photosensitive to green, red and infrared light.

In a further preferable embodiment, the yellow image forming layer contains a blue-sensitive silver halide emulsion, the magenta image forming layer contains a green-sensitive silver halide emulsion and the cyan image forming layer contains a red-sensitive silver halide emulsion. The above-mentioned yellow and cyan image forming layers are each mixed with a silver halide emulsion photosensitive to blue, green and red light.

Besides the above-mentioned combinations, the color sensitivities of emulsions Y, M and C may freely be selected and any combinations can be used, provided that the color sensitivities thereof are different from each other. Emulsion P may be contained in at least one of the yellow, magenta and cyan layers.

Silver halide emulsion (that is Emulsion P), which has a spectral sensitivity having a portion common to the spectral sensitivities of the yellow, magenta and cyan image forming silver halide emulsions of the invention, may be realized by selecting spectrally sensitizing dyes. For example, the emulsions photosensitive to blue, green and red light can be prepared by making combination use of a blue-sensitive sensitizing dye, a green-sensitive sensitizing dye and a red-sensitive sensitizing dye.

In the silver halide photographic photosensitive materials relating to the invention, the grain sizes each of the emulsion layers thereof can be determined from the wide ranges thereof, by taking variously required characteristics into consideration, including particularly sensitivities, sensitivity balance, color-separability, image sharpness, graininess and so forth.

In one of the preferable embodiments of the invention, the silver halide grain sizes preferably applicable thereto are within the range of 0.1 $\mu$m to 0.6 $\mu$m for the red-sensitive emulsions, 0.15 $\mu$m to 0.8 $\mu$m for the green-sensitive emulsions and 0.3 $\mu$m to 1.2 $\mu$m for the blue-sensitive emulsions.

There is no special limitation to the grain sizes of the aforementioned Emulsion P relating to the invention. However, the average grain sizes thereof have each a ratio within the range of 0.4 to 3.0 and, preferably, 0.7 to 2.0 to the largest average grain size among those of Emulsions Y, M and C.

In the silver halide photographic photosensitive materials relating to the invention, gelatin is preferably used as the binders thereof. Particularly for removing the colored components of the gelatin, it is preferable to use the gelatin improved in the transmittance ratio by treating a gelatin extracted solution with hydrogen peroxide, by extracting the colored components from the raw material that is a hydrogen peroxide treated ossein, or by making use of an ossein prepared of a colorless raw bone.

The gelatin of the invention may be any one of alkali-treated ossein gelatin, acid-treated gelatin, a gelatin derivative and denatured gelatin. Among them, alkali-treated ossein gelatin is particularly preferable to be used.

As for the gelatin applicable to the silver halide photographic photosensitive materials relating to the invention, they are preferable to have a transmittance of not less than 70% when a 10% gelatin solution is prepared and is then the transmittance thereof is measured at 420 nm through a spectrophotometer. The transmittance can be increased in the above-mentioned method. However, it is also preferable to increase the transmittance in a method for applying a hydrogen peroxide treatment in an ossein preparation stage, another method for adding hydrogen peroxide into an ossein liming tank so that the hydrogen peroxide may be reacted with the ossein in the liming process, or a further method for making use of hydrogen peroxide in a gelatin extracted solution. The hydrogen peroxide solution available on the market can be used therein. The condensation of the hydrogen peroxide, the time for adding and reacting it, and the methods for washing it are each suitably determined by optimizing these factors.

In the gelatin of the invention, the jelly hardness thereof (obtained in a PAGI method) is preferably not less than 250 g and particularly not less than 270 g.

There is no special limitation to the ratios of an amount of gelatin of the invention to the total amount of the coated gelatin. However, it is preferable to apply the ratios as high as possible. Concretely, a preferable effect can be obtained when applying a ratio within the range of at least not less than 20% and up to 100%.

In the photosensitive materials relating to the invention, the total amount of gelatin contained into the image forming side thereof is to be preferably less than 11 g/m². There is no special limitation to the lower limit of the total amount thereof. However, it is preferable to be in an amount of not less than 3.0 g/m², generally from the viewpoint of the physical properties or photographic characteristics. Such a gelatin amount as mentioned above can be obtained by converting it into the weight of gelatin having a 11.0% moisture content, in a moisture measuring method described in the above-mentioned Puggy method.

The yellow, magenta and cyan image forming layers of the invention are multicoated over a support. They may be arranged in any order from the support side. For example, one of the preferable embodiments is that a cyan image forming layer, a magenta image forming layer and a yellow image forming layer are arranged in this order from the support side. Besides the above, it is allowed to arrange an intermediate layer, a filter layer and a protective layer, if required.

Among the silver halide photographic photosensitive materials of the invention, a silver halide color photographic photosensitive material is preferable, in which, after completing a photographic process comprising a color developing step, the yellow, magenta and cyan image forming layers have the maximum monochromatic yellow, magenta and cyan densities each within the range of 1.50 to 1.90, respectively, and each of the color component densities of the black color, which is formed by adding each of the maximum monochromatic densities and the maximum density of a black image forming layer, is not less than 1.90, respectively.

Also among the silver halide photographic photosensitive materials of the invention, another silver halide color photographic photosensitive material is preferable, in which, after completing a photographic process comprising a color developing step, the yellow, magenta and cyan image forming layers have the monochromatic yellow, magenta and cyan tones in the toe portions thereof each of not less than 1.7, respectively. The term, 'a tone in a toe portion', herein expressed, in a characteristic curve, in terms of an absolute value of the inclination of the straight line connected between a point of a density of 0.15 above the minimum density point and another point of a density 0.80 above the same minimum density point.

The methods for hardening the above-mentioned tones in a toe portion include, for example, a method for narrowing the grain size distribution of silver halide emulsion grains. In the case of a color developer, for example, the tones in the toe portions can be hardened by increasing the amount of a color developing agent, decreasing the amount of hydroxylamine or a sulfite as a preservative to be replaced by a weak reducing agent such as xylole or sorbitol, by increasing a penetrant (such as benzyl alcohol), and by increasing the pH, temperature and developing time of a processing chemical while adding an antifoggant and a toe-portion cutting agent.

In the case of a photosensitive material, a hydroquinone derivative capable of reducing an oxidized developing agent can effectively be used in the photosensitive material. These derivatives include, particularly, the compounds having the following Formula [AO-I] or [AO-II] as the compounds capable of effectively hardening the tones in the toe portions without spoiling any color hues and others.

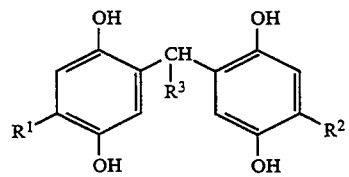

Formula [AO-I]

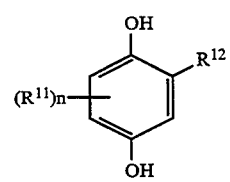

Formula [AO-II]

In Formula [AO-I], $R^1$ and $R^2$ represent each a hydrogen atom, an alkyl group having not more than 8 carbon atoms (such as a group of methyl, ethyl, t-butyl or sec-hexyl), an alkoxy group (such as a group of methoxy, ethoxy or butoxy), an alkylthio group (such as a group of methylthio, butylthio or octylthio) or an alkylamido group (such as a group of methaneamido, propaneamido or 2-ethylpentanoylamido) and $R^3$ represents a hydrogen atom or an alkyl group having not more than 11 carbon atoms (such as a group of methyl, propyl, heptyl or undecyl); provided, $R^1$ and $R^2$ preferably represent each an alkyl group having not more than 6 carbon atoms, and $R^3$ preferably represents an alkyl group having not more than 7 carbon atoms.

The carbon atoms in total belonging to $R^1$, $R^2$ and $R^3$ are within the range of 8 to 22 and, preferably, 8 to 17.

In Formula [AO-II], $R^{11}$ and $R^{12}$ represent each a hydrogen atom or an alkyl group having not more than 5 carbon atoms (such as a group of methyl, ethyl, i-propyl, butyl, t-butyl, pentyl, t-pentyl or neo-pentyl), and n is an integer of 1 to 3.

The compounds represented by Formula [AO-I] can be synthesized in accordance with the processes described in JP OPI Publication No. 52-146235/1977, JP Examined Publication No. 56-21145/1981, JP OPI Publication No. 59-37497/1984 and so forth. The typical compounds thereof include, for example, those denoted by I-(1) through I-(12) given in JP OPI Publication No. 4-30164, pp. 67–69.

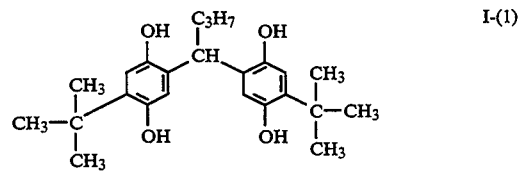

I-(1)

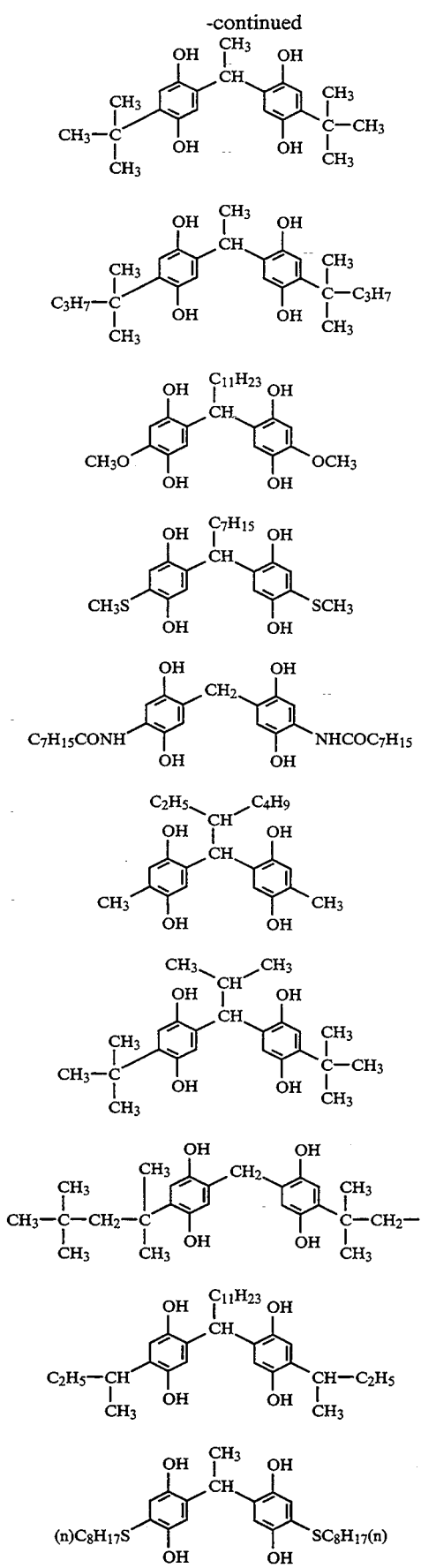

The typical and concrete examples of the compounds represented by Formula [AO-II] will be given below. However, the compounds thereof shall not be limited thereto.

The compounds represented by Formula [AO-I] may be added in an amount within the range of $2\times10^{-8}$ to $2\times10^{-2}$ mols/m$^2$, preferably $2\times10^{-7}$ to $2\times10^{-3}$ mols/m$^2$ and particularly $2\times10^{-6}$ to $2\times10^{-4}$ mols/m$^2$.

The compounds represented by Formula [AO-II] may be added in an amount within the range of preferably 0.001 to 0.50 g/m$^2$ and particularly 0.005 to 0.20 g/m$^2$. These compounds may be used independently or in combination. It is also allowed to use the compounds represented by Formula [AO-II] after adding a quinone derivative having not less than 5 carbon atoms thereto. In any cases thereof, the compounds are used in the total amounts preferably within the range of 0.001 to 0.50 g/m$^2$.

In forming an internal latent image forming type direct positive image preferably applicable to the invention, the fogging treatment can be performed by making an overall flood exposure or by making use of a foggant that is a compound capable of producing fogging nuclei.

The above-mentioned overall flood exposure can be performed by dipping or wetting an imagewise exposed photosensitive material in a developer or other aqueous solution and then by exposing the photosensitive material overall and uniformly to flood light. Any light sources are applicable thereto, provided that they are capable of emitting the light having the same photosensitive wavelength region as that of the photosensitive material. Therefore, the high illuminance light such as flash light can be used for a short time or weak light can also be used for a long time. The overall flood exposure time may be widely varied so that the best positive image can finally be obtained to meet the photographic photosensitive material, the development requirements, the kinds of light sources used therein and so forth. It is preferable to the utmost that the exposure quantity for an overall flood exposure is to be within the range prescribed to meet the combination with a subject photosensitive material. Usually, when giving an excessive exposure quantity, the minimum density is made higher or a desensitization is induced thereby. Therefore, the resulting image quality tends to be deteriorated.

Next, the foggants preferably applicable to the invention will be detailed below.

As for the foggants applicable to the invention, a wide variety of compounds can be used. The foggants ma be made present in the course of carrying out a development. For example, the foggants may be contained in the component layers of a photographic photosensitive material other than the support thereof, (among the layers, the silver halide emulsion layers are particularly preferable). The foggants may also be contained in a developer or in a processing solution to be used in advance of the developing step. The amount of the foggant used therein may be widely varied to meet the requirements. The amount thereof used is within the range of 1 to 1,500 mg and preferably 10 to 1,000 mg when adding it into a silver halide emulsion layer, and within the range of 0.01 to 5 g/liter and preferably 0.05 to 1 g/liter when adding it into a processing solution such as a developer.

The foggants applicable to the invention include, for example, hydrazines given in U.S. Pat. Nos. 2,563,785 and 2,588,982; hydrazide or hydrazine compounds given in U.S. Pat. No. 3,227,552; heterocyclic quaternary nitrogen salt compounds given in U.S. Pat. Nos. 3,615,615, 3,718,479, 3,719,494, 3,734,738 and 3,759,901; and the compounds having an adsorption group to silver halide surfaces, such as acylhydrazinophenylthio ureas given in U.S. Pat. No 4,030,925. These foggants may also be used in combination. For example, the foregoing RD 15162 describes that a non-adsorption type foggant is used with an adsorption type foggant in combination. This combination technique is also effective to the invention.

As for the foggants applicable to the invention, any one of those of the adsorption type and the non-adsorption type can be used and the combinations thereof can also be used.

The typical examples of the useful foggants may be given as follows. Namely, hydrazine compounds including hydrazine hydrochloride, 4-methylphenyl hydrazine hydrochloride, 1-acetyl-2-phenyl hydrazine, 1-formyl-2-(4-methylphenyl) hydrazine, 1-methylsulfonyl-2-phenyl hydrazine, 1-methylsulfonyl-2-(3-phenylsulfonamidophenyl) hydrazine, 1-benzoyl-2-phenyl hydrazine and formaldehydephenyl hydrazine; N-substituted quaternary cycloammonium salts including 3-(2-formylethyl)-2-methylbenzothiazolium bromide, 3-(2-acetyl ethyl)-2-benzyl-5-phenylbenzoxazolium bromide, 3-(2-acetyl ethyl)-2-benzylbenzoselenazolium bromide, 2-methyl-3-[3-(phenyl hydrazino) propyl] benzothiazolium bromide, 1,2-dihydro-3-methyl-4-phenyl pyrido [2,1-b] benzothiazolium bromide, 1,2-dihydro-3-methyl-4-phenyl pyrido [2,1-b] benzoselenazolium bromide and 4,4′-ethylene bis(1,2-dihydro-3-methyl pyrido [2,1-b] benzothiazolium bromide; 5-(3-ethyl-2-benzothiazolinidene)-3-[4-(2-formyl hydrazino) phenyl] rhodanine, 1,3-bis[4-(2-formyl hydrazino) phenyl] thiourea, 7-(3-ethoxythiocarbonylamino benzamido)-9-methyl-10-propargyl-1,2,3,4-tetrahydroacridinium trifluoromethane sulfonate and 1-formyl-2-[4-{3-(2-methoxyphenyl) ureido} phenyl] hydrazine.

With any one of the photographic photosensitive materials comprising the silver halide emulsion layers relating to the invention, a direct positive image can be formed by exposing imagewise the photosensitive material to light and then by developing it, upon making an overall flood exposure or in the presence of a foggant.

As for the developing agents applicable to the developers for developing the photographic photosensitive materials relating to the invention, the typical examples thereof may be given as follows. Namely, common silver halide developing agents including polyhydroxy benzenes such as hydroquinone, aminophenols, 3-pyrazolidones, ascorbic acid and the derivatives thereof, reductons, phenylenediamines or the mixtures thereof. The concrete examples thereof may further be given as follows. Namely, hydroquinone, aminophenol, N-methylaminophenol, 1-phenyl-3-pyrazolidone, 1-phenyl-4,4-dimethyl-3-pyrazolidone, 1-phenyl-4-methyl-4-hydroxymethyl-3-pyrazolidone, ascorbic acid, N,N-diethyl-p-phenylenediamine, diethylamino-o-toluidine, 4-amino-3-methyl-N-ethyl-N-($\beta$-methanesulfonamidoethyl) aniline, 4-amino-3-methyl-N-ethyl-N-($\beta$-hydroxyethyl) aniline, 4-amino-N-ethyl-N-($\beta$-hydroxyethyl) aniline and so forth. It is also allowed that the above-given developing agents may be contained in an emulsion in advance so that the developing agents can work on silver halides when they are dipped in an aqueous high pH solution.

The color photosensitive materials relating to the invention are preferable to contain a nitrogen-containing heterocyclic compound having a mercapto group represented by the following Formula [XI] (hereinafter referred to as a mercapto compound).

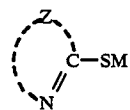

Formula [XI]

wherein M represents a hydrogen atom, an alkali metal atom, an ammonium group or the protective group for a mercapto group, and Z represents the group consisting of non-metal atoms necessary to form a heterocyclic ring, provided the heterocyclic ring may have a substituent or may also be condensed.

The protective groups for the mercapto groups represented by M include the groups by which a mercapto group can be formed by cleaving themselves with alkali. They include, typically, an acyl group, an alkoxycarbonyl group and an alkylsulfonyl group.

The above-mentioned nitrogen-containing heterocyclic groups each may have the ring-forming atoms such as carbon atom, nitrogen atom, oxygen atom, sulfur atom and selenium atom. The 5 to 6 membered rings are preferable. The typical examples of the heterocyclic rings include those of imidazole, benzoimidazole, naphthoimidazole, thiazole, thiazoline, benzothiazole, naphthothiazole, oxazole, benzoxazole, naphthoxazole, selenazole, benzoselenazole, naphthoselenazole, triazole, benzotriazole, tetrazole, oxadiazole, thiadiazole, pyridine, pyrimidine, triazine, purine, and azaindene.

The substituents which are substituted in these heterocyclic rings include, for example, a halogen atom and the groups of hydroxyl, amino, nitro, mercapto, carboxyl or the salts thereof, sulfo or the salts thereof, alkyl, alkoxy, aryl, aryloxy, alkylthio, arylthio, acylamino, sulfonamido, carbamoyl or sulfamoyl.

Among the compounds represented by Formula [XI], the preferably applicable compounds may be represented by the following Formulas [XII], [XIII] and [XIV].

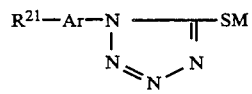 Formula [XII]

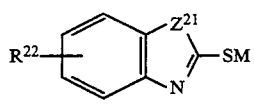 Formula [XIII]

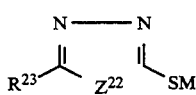 Formula [XIV]

In Formulas [XII] through [XIV], M is synonymous with M denoted in Formula [XI], $R^{21}$ and $R^{22}$ represent each a group substitutable to a benzene ring, Ar represents a phenyl group, $R^{23}$ represents a halogen atom or a group of hydroxyl, amino, nitro, mercapto, carboxyl or the salts thereof, or a group of alkyl, aryl, aryloxy, alkylthio, arylthio, acylamino, sulfonamido or carbamoyl, and $Z^{21}$ and $Z^{22}$ represent each an oxygen atom, a sulfur atom or —NH—.

The typical examples of the compounds represented by Formula [XI] include the compounds (1) through (39) given in JP OPI Publication No. 64-73338/1989, pp.11-15.

These compounds can readily be synthesized in any well-known methods including, for example, the methods described in U.S. Pat. Nos. 2,403,927 and 3,376,310, JP OPI Publication No. 55-59463/1980 and Journal of Chemical Society, 1952, p.4237. Some of the compounds are available on the market.

The mercapto compounds of the invention can be added into photosensitive materials by dissolving them in water or a hydrophilic organic solvent such as methanol and acetone, or by dissolving them in a weak alkali or a weak acid. The amount thereof to be added may be varied suitably to meet the kinds of compounds used therein or the layers subject to the addition of the compounds. When they are added into silver halide emulsion layers, they are generally added in an amount within the range of $10^{-8}$ to $10^{-2}$ mols and, preferably, $10^{-6}$ to $10^{-3}$ mols, per mol of silver halide used.

The developers applicable to the invention may further contain a specific antifoggant and a development inhibitor, or these additives to developers can also be optionally incorporated into the component layers of photographic light sensitive materials.

The silver halide photographic light sensitive materials of the invention can be applied with any known photographic additives.

The well-known photographic additives include, for example, the following compound given in RD 17643 and RD 18176.

| Additives | RD 17643 Page | RD 17643 Group | RD 18716 Page | RD 18716 Group |
|---|---|---|---|---|
| Chemical sensitizer | 23 | III | 648 | Upper right |
| Sensitizing dye | 23 | IV | 648 | Upper right |
| Development inhibitor | 29 | XXI | 648 | Upper right |
| Antifoggant | 24 | VI | 649 | Lower right |
| Stabilizer | 24 | VI | 649 | Lower right |
| Color stain preventive | 25 | VII | 650 | Left-right |
| UV abosorbent | 25~26 | VII | 649 | R ~ 650 L |
| Filter dye | 25~26 | VII | 649 | R ~ 650 L |
| Whitening agent | 24 | V | | |
| Hardener | 26 | X | 651 | R |
| Coating aid | 26~27 | XI | 650 | R |
| Surfactant | 26~27 | XI | 650 | R |
| Plasticizer | 27 | XII | 650 | R |
| Lubricant | 27 | XII | 650 | R |
| Antistatic agent | 27 | XII | 650 | R |
| Matting agent | 28 | XVI | 650 | R |
| Binder | 29 | IX | 651 | R |

The emulsion layers of the light sensitive materials relating to the invention can be applied each with a dye forming coupler capable of producing a dye upon making a coupling reaction with the oxidized products of a color developing agent. The dye forming couplers are usually selected respectively to be able to produce dyes capable of absorbing the rays of light having the photospectral sensitivities of the corresponding emulsion layers. That is to say, a yellow dye forming coupler is applied to a blue-sensitive emulsion layer; a magenta dye forming coupler, to a green-sensitive emulsion layer; and a cyan dye forming coupler, to a red-sensitive emulsion layer; respectively. However, it is also allowed to prepare a silver halide color photographic light sensitive material in any other ways than the above-mentioned combination so as to meet the purposes.

It is preferable that these dye-forming couplers are to contain a so-called ballast group, that is, a non-coupler-diffusing group having not less than 8 carbon atoms in the molecules of the coupler. These dye-forming couplers may be either one of those of the 4-equivalent type in which the silver ions of the four molecules are required to be reduced for forming one molecule of a dye, and those of 2-equivalent type, in which the silver ions of the two molecules are required for forming one molecule of a dye. It is also allowed to use a DIR coupler capable of releasing a development inhibitor while carrying out a development so that the sharpness and graininess of the resulting images can be improved, or a DIR compound capable of producing a colorless compound upon making a coupling reaction with the oxidized products of a developing agent and, at the same time, releasing a development inhibitor.

The DIR couplers and DIR compounds each applicable thereto include those each directly bonding an inhibitor to the coupling position thereof, and those each bonding an inhibitor to the coupling position thereof through a divalent group and the inhibitor can be released with any one of an intramolecular nucleophilic reaction, an intramolecular electron-transfer reaction and so forth produced in the group split off in the coupling reaction, (these couplers and compounds are referred to as timing DIR couplers and timing DIR compounds, respectively.)

A colorless coupler capable of making a coupling reaction with the oxidized products of an aromatic primary amine developing agent, but incapable of producing any dye (that is also so-called a competing coupler) may also be used with a dye forming coupler in combination.

In the magenta image forming layers relating to the invention, the compound represented by the following Formula [M-I] is preferably contained.

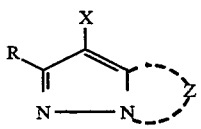

Formula [M-I]

In the above-given formula, Z represents a group consisting of non-metal atoms necessary to form a nitrogen-containing heterocyclic ring, provided that the ring formed of the above-mentioned Z may also have a substituent.

X represents a hydrogen atom or a group capable of splitting off upon making a reaction with the oxidized products of a color developing agent; and R represents a hydrogen atom or a substituent.

In the above-given Formula [M-I], there is no special limitation to the substituents represented by R. However, they include, typically, each of the groups of alkyl, aryl, anilino, acylamino, sulfonamido, alkylthio, arylthio, alkenyl or cycloalkyl and, besides, they also include, a halogen atom, each of the groups of cycloalkenyl, alkinyl, heterocyclic, sulfonyl, sulfinyl, phosphonyl, acyl, carbamoyl, sulfamoyl, cyano, alkoxy, aryloxy, heterocyclic-oxy, siloxy, acyloxy, carbamoyloxy, amino, alkylamino, imido, ureido, sulfamoylamino, alkoxycarbonylamino, alkoxycarbonyl, aryloxycarbonyl or heterocyclic-thio, and a spiro-compound residual group and a cross-linked hydrocarbon compound residual group.

The substituents represented by R, the groups capable of splitting off upon making a reaction with the oxidized products of a color developing agent, the nitrogen-containing heterocyclic rings formed by Z and the rings formed by Z, each may have the above-mentioned substituents, as described above. The preferable scope of the substituents and the typical examples thereof, and the preferable scope of the magenta couplers represented by Formula [M-I] are each the same as those given in European Patent Publication No. 0327272, p.5, the 23rd line to p.8, the 52th line.

The typical examples of the magenta couplers represented by Formula [M-I] will be given below.

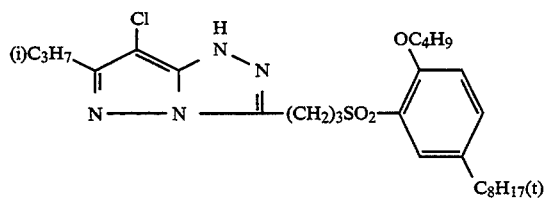

M-1

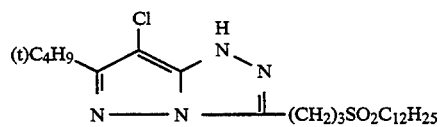

M-2

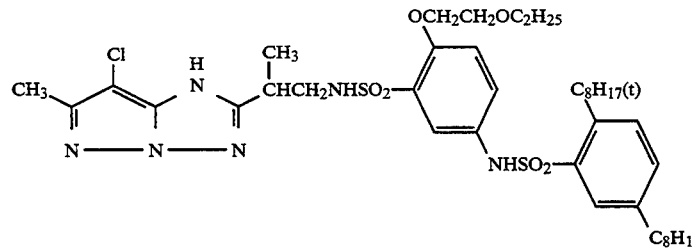

M-3

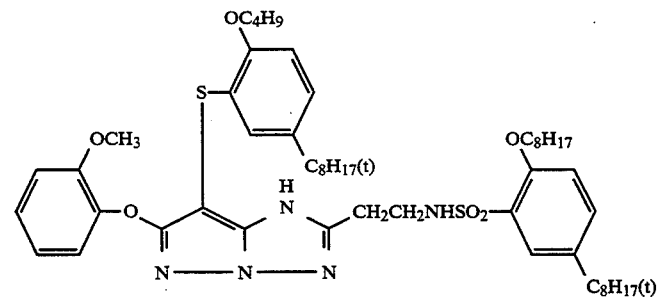

M-4

-continued
M-5
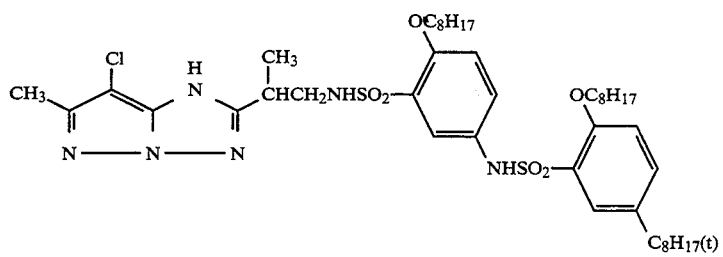
M-6
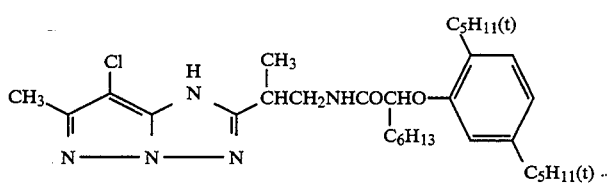
M-7
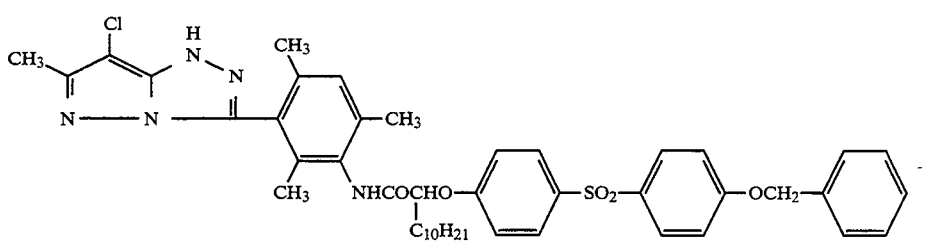
M-8
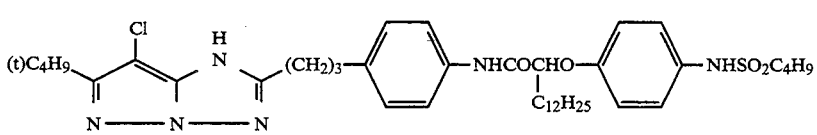
M-9
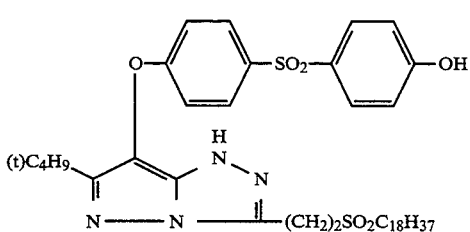
M-10
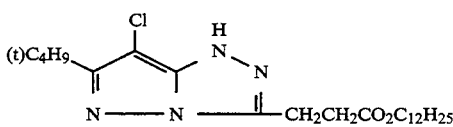
M-11
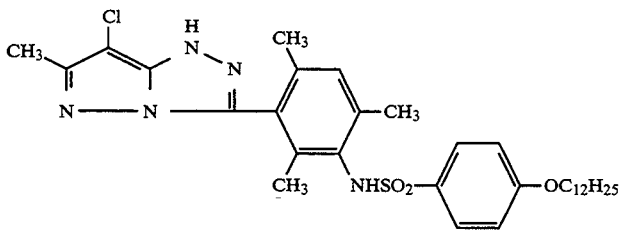
M-12
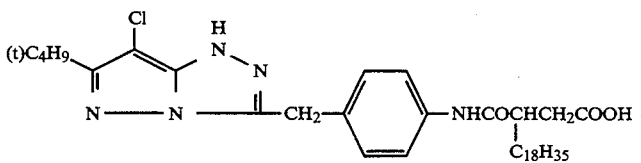

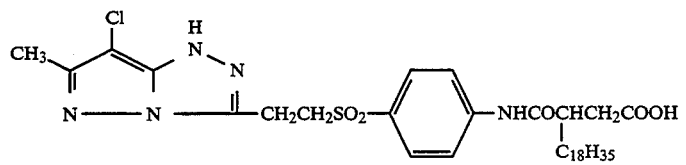
M-13
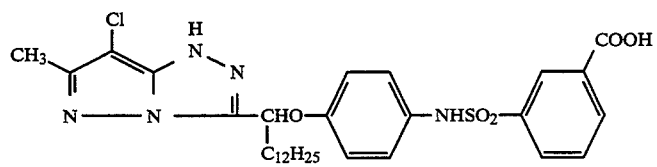
M-14
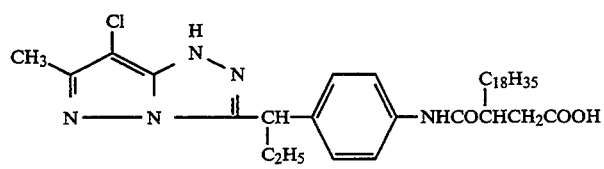
M-15
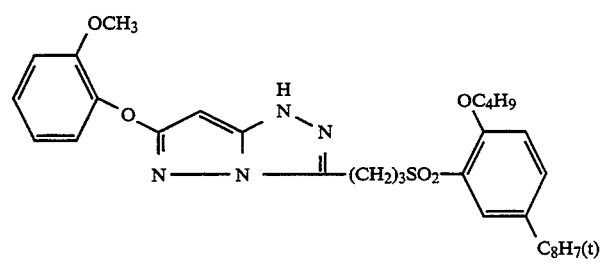
M-16
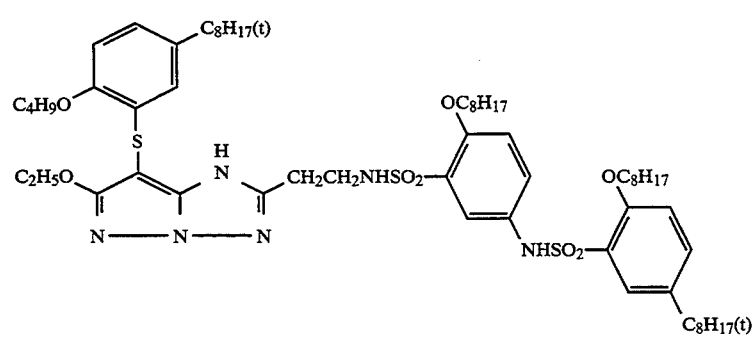
M-17
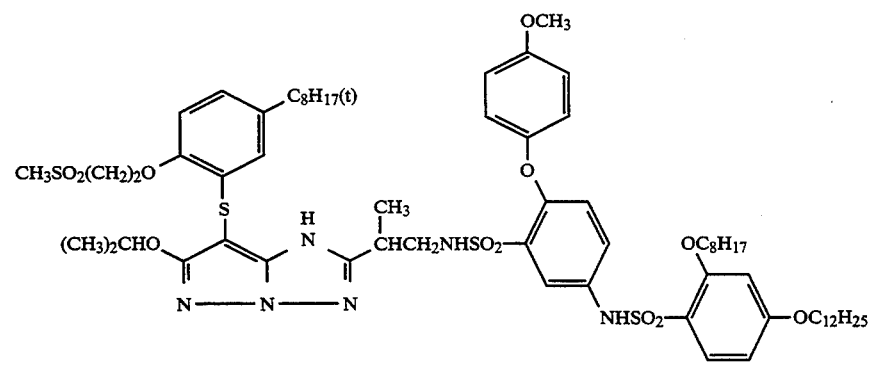
M-18

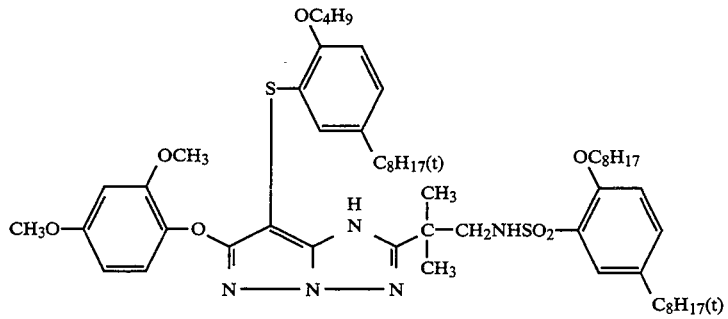

M-19

Further, the other typical examples thereof include those other than the above-given typical examples given in the compounds M-1 through M-16 given in European Patent Publication No. 0273712, pp. 6–21 and the compounds 1 through 223 given in European Patent Publication No. 0235913, pp. 36–92.

The aforementioned couplers can be synthesized with reference to Journal of the Chemical Society, Perkin I, 1977, 2047–2052; U.S. Pat. No 3,725,067; and JP OPI Publication Nos. 59-99437/1984, 58-42045/1983, 59-162548/1984, 59-171956/1984, 60-33552/1985, 60-43659/1985, 60-172982/1985, 60-190779/1985, 62-209457/1987 and 63-307453/1988.

The above-described couplers may also be used with other kinds of magenta couplers in combination and may be commonly used in an amount within the range of $1 \times 10^{-3}$ mols to 1 mol and, preferably, $1 \times 10^{-2}$ mols to $8 \times 10^{-1}$ mols, each per mol of silver halide used.

In the color photographic light sensitive materials of the invention, $\lambda L0.2$ of the spectral absorption of a magenta image is preferably within the range of 580 to 635 nm.

In the silver halide color photographic light sensitive materials of the invention, when the $\lambda L0.2$ thereof is within the range of 580 to 635 nm, the $\lambda max$ of the spectral absorption of a magenta image is preferably within the range of 530 to 560 nm.

In the silver halide color photographic light sensitive materials of the invention, the $\lambda L0.2$ and $\lambda max$ of the spectral absorption of a magenta image are the values measured in the following procedures.

(Procedures for measuring $\lambda L0.2$ and $\lambda max$)

In the case of a positive type silver halide color photographic light sensitive material, it is exposed uniformly to red light having a minimum quantity to obtain the minimum density of a cyan image and is then exposed uniformly to blue light having a minimum quantity to obtain the minimum density of a yellow image. Successively, it is exposed to white light through an ND filter and then developed. At that time, the ND filter density is so adjusted as to have the maximum value of a light absorbance of 1.0, when the spectral absorption between 500 and 700 nm is measured upon attaching an integrating sphere to a spectrophotometer, and a zero correction is made by a standard white plate made of magnesium oxide, so that a magenta image can be formed.

In the case of a negative type silver halide color photographic light sensitive material, an ND filter density is so adjusted as to have the maximum light absorbance in the same manner as in the case of the positive type light sensitive materials, when a magenta image is formed by exposing the light sensitive material to green light through the ND filter and is then developed. The term, $\lambda L0.2$, herein means a wavelength longer than the wavelengths showing the maximum light absorbance of 1.0 in the spectral absorbance curve of the magenta image, that is, the wavelength showing a light absorbance of 0.2.

In the silver halide photographic photosensitive materials relating to the invention, the magenta image forming layer thereof contains a yellow coupler as well as a magenta coupler. The difference of the pKa between these couplers is to be preferably within two and particularly within 1.5.

In the magenta image forming layer of the invention, the magenta couplers to be contained therein are those represented by the following Formula [Y-Ia]. Among the yellow couplers represented by Formula [Y-Ia] and when they are contained therein together with a magenta coupler represented by Formula M-1] in combination, the particularly preferable yellow couplers include, for example, those having a pKa value of not less than 3 as compared with a pKa value of the coupler represented by Formula [M-1] that is subject to the combination use.

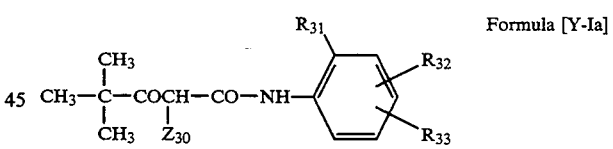

Formula [Y-Ia]

In Formula [Y-Ia], $R_{31}$ represents a halogen atom or an alkoxy group; $R_{32}$ represents a hydrogen atom, a halogen atom or an alkoxy group that may have a substituent; $R_{33}$ represents an acylamino group, an alkoxycarbonyl group, an alkylsulfamoyl group, an arylsulfamoyl group, an arylsulfonamido group, an alkylureido group, an arylureido group, a succinimido group, an alkoxy group or an aryloxy group, each of which may have a substituent.

$Z_{30}$ represents a hydrogen atom, a monovalent organic group capable of splitting off upon coupling with the oxidized products of a color developing agent, or a halogen atom.

The typical examples of the compounds preferably applicable thereto include the compounds (Y-1) through (Y-58) given in JP OPI Publication No. 2-139542/1990, pp.(13)–(17), as well as the following compounds Y-2 and Y-2. However, the invention shall not be limited thereto.

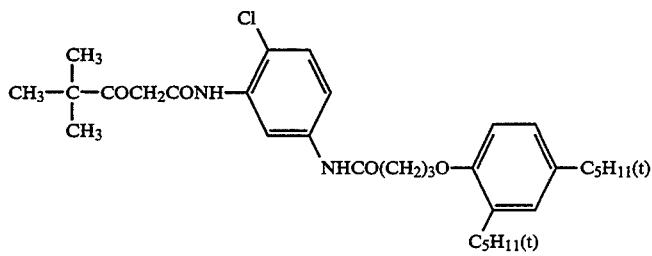

Y-1

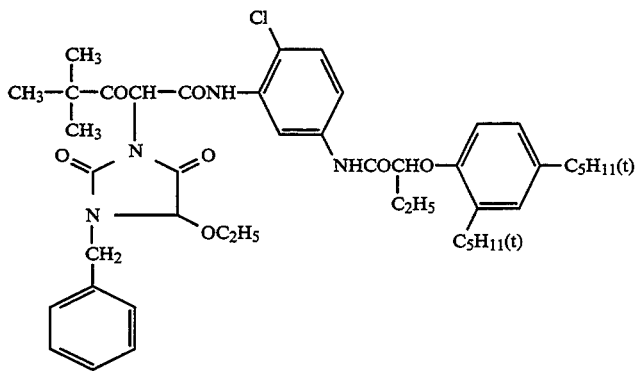

Y-2

In the magenta image forming layer of the silver halide color photographic photosensitive materials of the invention, the proportion of the magenta and yellow coupler contents may be so determined as to make approximate the spectral absorption of a dye image obtained by color developing the magenta image forming layer to the spectral absorption of a printed image obtained by printing it with a magenta printing ink. To be more concrete, the yellow coupler content is suitably to be within the range of 0.02 to 0.5 mols per mol of the magenta couplers used.

In the silver halide color photographic photosensitive materials of the invention, the yellow couplers which are preferably contained in the magenta image forming layer include, for example, those represented by the foregoing Formula [Y-Ia].

In the invention, as for the cyan couplers, which are to be contained in a cyan image forming layer, cyan dye-forming couplers of the phenol or naphthol type may be used.

Among them, the couplers represented by the following Formula [C-I] or [C-II] may preferably be used.

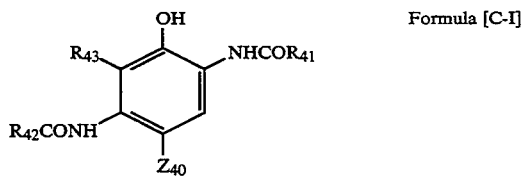

Formula [C-I]

In Formula [C-I], $R_{41}$ represents an aryl, cycloalkyl or heterocyclic group; $R_{42}$ represents an alkyl or phenyl group; and $R_{43}$ represents a hydrogen or halogen atom, or an alkyl or alkoxy group.

$Z_{40}$ represents a hydrogen atom or a group capable of splitting off upon reacting with the oxidized products of an aromatic primary amine type color developing agent.

Formula [C-II]

In Formula [C-II], $R_{44}$ represents an alkyl group (such as a group of methyl, ethyl, propyl, butyl or nonyl); $R_{45}$ represents an alkyl group (such as a group of methyl or ethyl); $R_{46}$ represents a hydrogen atom, a halogen atom (such as fluorine, chlorine or bromine) or an alkyl group (such as a group of methyl or ethyl); $Z_{47}$ is synonymous with $Z_{40}$ denoted in Formula [C-I] and represents a hydrogen atom or a group capable of splitting off upon reacting with the oxidized products of an aromatic primary amine type color developing agent.

The above-mentioned cyan couplers are detailed in, for example, U.S. Pat. Nos. 2,306,410, 2,356,475, 2,362,596, 2,367,531, 2,369,929, 2,423,730, 2,474,293, 2,476,008, 2,498,466, 2,545,687, 2,728,660, 2,772,162, 2,895,826, 2,976,146, 3,002,836, 3,419,390, 3,446,622, 3,476,563, 3,737,316, 3,758,308 and 3,839,044; British Patent Nos. 478,991, 945,542, 1,084,480, 1,377,233, 1,388,024 and 1,543,040; and JP OPI Publication Nos. 47-37425/1972, 50-10135/1975, 50-25228/1975, 50-112038/1975, 50-117422/1975, 50-130441/1975, 51-6551/1976, 51-37647/1976, 51-52828/1976, 51-108841/1976, 53-109630/1978, 54-48237/1979, 54-66129/1979, 54-131931/1979, 55-32071/1980, 59-146,050/1984, 59-31,953/1984 and 60-117,249/1985.

In each of silver halide emulsion layers, the couplers applicable to the invention may be used ordinarily in an amount within the range of $1\times10^{-3}$ to 1 mol and, preferably, $1\times10^{-2}$ to $8\times10^{-1}$ mols per mol of silver halide.

The above-mentioned couplers are usually dissolved in a high boiling organic solvent having a boiling point of not less than 150° C. and, if required, a low boiling and/or water-soluble organic solvent in combination, and the resulting solution is emulsified and dispersed, in a hydrophilic binder such as an aqueous gelatin solution, by making use of a surfactant. After that, the resulting dispersed emulsion may be added into an objective hydrophilic colloidal layer. Wherein, it is also allowed to supplement with a step for removing the low boiling organic solvent after completing or at the same time of the dispersion.

In the invention, the proportion of the high boiling organic solvent relating to the invention to the low boiling organic solvent is to be within the range of 1:0.1 to 1:50 and, preferably, 1:1 to 1:20.

The high boiling organic solvents relating to the invention may be those of the any types, provided that they are the compound having a permittivity of not higher than 6.0. There is no special limitation to the lower limit, but the permittivity thereof is preferably not less than 1.9. These solvents include, for example, esters such as a phthalate and a phosphate, organic acid amides, ketones and hydrocarbon compounds, each having a permittivity of not higher than 6.0, and, preferably, phthalates or phosphates.

In the emulsion layers of the photosensitive materials relating to the invention, it is allowed to use a dye-forming coupler capable of forming dyes upon making coupling reaction with the oxidized products of a color developing agent. The dye-forming couplers are usually selected so as to meet the corresponding emulsion layers, respectively, so that the dyes can be produced to absorb the photospectra of the emulsion layer. Therefore, a yellow dye-forming coupler is used in a blue-sensitive emulsion layer; a magenta dye-forming coupler, in a green-sensitive emulsion layer; and a cyan dye-forming coupler, in a red-sensitive emulsion layer; respectively. However, a silver halide color photographic photosensitive material may also be prepared in any combinations different from the above-mentioned combination so as to meet the requirements.

It is preferable that these dye-forming couplers are to contain a so-called ballast group, that is, a non-coupler-diffusing group having not less than 8 carbon atoms in the molecules of the couplers. These dye-forming couplers may be either one of those of the 4-equivalent type in which the silver ions of the four molecules are required to be reduced for forming one molecule of a dye, and those of the 2-equivalent type, in which the silver ions of the two molecules are required for forming one molecule of a dye. It is also allowed to use a DIR coupler capable of releasing a development inhibitor while carrying out a development so that the sharpness and graininess of the resulting images can be improved, or a DIR compound capable of producing a colorless compound upon making a coupling reaction with the oxidized products of a developing agent and, at the same time, releasing a development inhibitor.

The DIR couplers and the DIR compounds each applicable thereto include those each directly bonding an inhibitor to the coupling position thereof through a divalent grow and the inhibitor can be released with any one of an intramolecular nucleophilic reaction, an intramolecular electron-transfer reaction and so forth produced in the group split off in the coupling reaction, (these couplers and compounds are referred to as timing DIR couplers and timing DIR compounds, respectively).

A colorless coupler capable of making a coupling reaction with the oxidized products of an aromatic primary amine developing agent, but incapable of producing any dye (that is also so-called a competing coupler) may also be used with a dye forming coupler in combination.

The yellow dye forming couplers applicable thereto include, for example, well-known acyl acetanilide type couplers. Among them, the benzoyl acetoanilide type and pivaloyl acetanilide type compounds can advantageously be used.

In the invention, $\lambda L0.2$ of a yellow image is preferably 515 nm.

In the invention, '$\lambda L0.2$' is defined as follow. In the following defined spectral absorbance $A(\lambda)$ of a yellow image, an average absorbance value Am from 560 to 650 nm is standardized, $$\left( Am = \frac{\int_{560}^{650} Ad\lambda}{650 - 560} \right)$$

and, in the yellow image, when the absorbance Amax thereof is $1.0 \pm 0.05$ higher than Am in wavelength $\lambda$max corresponding to the maximum absorbance Amax of the above-mentioned spectral absorbance, a wavelength on the longer wavelength side than the above-mentioned $\lambda$max and corresponding to absorbance $A = 0.8 \times Am + 0.2 \times Amax$ is defined as $\lambda L0.2$. Also, $\lambda L0.2$ means a wavelength showing $A = 0.2 \times Am + 0.8 \times Amax$ in the above-mentioned spectral absorbance.

Amax is a light absorbance in $\lambda$max of a yellow image and is usually obtained from the range of not less than 400 nm. When the maximum value of a color image is not obtained by other factors such as the presence of a UV absorbent or the like, such an Amax is represented by a light absorbance obtained from a wavelength between 400 to 500 nm in which the absolute value of $dA/d\lambda$ is minimized, that is, a light absorbance obtained in the shoulder portion.

The above-mentioned yellow image is formed by controlling the separation exposure conditions to be maximized so that Amax-Am can be minimized when the Amax-Am is $1.0 \pm 0.05$, and then by the development is carried out.

In the invention, the spectral absorption of the above-mentioned yellow image is to be preferably $\lambda L0.8 > 450$ nm and particularly $\lambda L0.8 > 455$ nm. And, $\lambda L0.2$ is to be preferably not more than 510 nm. $\lambda$max is to be preferably not less than 430 nm.

In this invention, the spectral absorption measurements are carried out through a spectrophotometer Model 320 manufactured by Hitachi, Ltd., to which an integrating sphere is attached.

When a light sensitive material of the invention contains a coupler as the substance for forming a yellow image, any types of couplers can be used therein, provided they can satisfy the above-mentioned requirements. However, the preferable couplers include, for example, the couplers represented by the following Formula [Y-I].

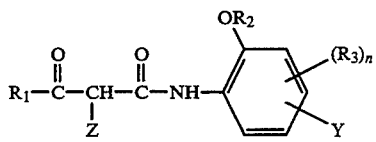

Formula [Y-I]

In the above-given formula, $R_1$ represents an alkyl or cycloalkyl group; $R_2$ represents an alkyl, cycloalkyl, acyl or aryl group; $R_3$ represents a group capable of being substituted to a benzene ring; n is an integer of 0 or 1; Y represents a monovalent ballast group; and Z represents a hydrogen atom or a group capable of splitting off when making a coupling reaction.

The concrete examples of the couplers preferably applicable thereto include, typically, the compounds Y-I-1 through Y-I-55 each given in JP OPI Publication No. 3-241345/1991 and, besides the above, the compounds Y-1 through Y-30 each given in JP OPI Publication No. 3-209466/1991 may also preferably be used.

In silver halide emulsion layers, the above-mentioned yellow coupler is usually contained in an amount within the range of $1 \times 10^{-3}$ to 1 mol and preferably $1 \times 10^{-2}$ to $8 \times 10^{-1}$ mols per silver halide used.

The cyan dye-forming couplers applicable thereto include, for example, those well-known as the phenol type, naphthol type of the imidazole type and, to be more concrete, they include, typically, a phenol type coupler substituted with an alkyl, acylamino or ureido group, a naphthol type coupler produced of a 5-aminonaphthol skeleton, and a 2-equivalent naphthol type coupler introduced thereinto with an oxygen atom as a split-off group.

In the photosensitive materials of the invention, any high boiling organic solvents can be used with couplers in combination. However, the preferably applicable organic solvents include, for example, those represented by the following Formula [HBS-I] or [HBS-II].

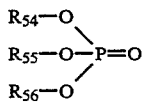

Formula HBS-I

In Formula [HBS-I], $R_{54}$, $R_{55}$ and $R_{56}$ represent each an alkyl or aryl group, provided that at least two of $R_{54}$, $R_{55}$ and $R_{56}$ represent each an alkyl group having not more than 16 carbon atoms.

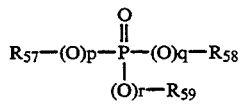

Formula [HBS-II]

In Formula [HBS-II], $R_{57}$, $R_{58}$ and $R_{59}$ represent each an aliphatic or aromatic group; and p, q and r represent each an integer of 0 or 1, provided that p, q and r shall not represent each an integer of 1 at the same time.

The typical examples of the compounds represented by Formula [HBS-I] or [HBS-II] include the compounds I-1 through II-95 given in JP OPI Publication No. 2-124568/1990. However, it is the matter of course that the invention shall not be limited thereto.

In the magenta image forming layer of the color photographic photosensitive materials of the invention, it is preferable to use a yellow coupler and a magenta coupler in combination so as to make the color tone approximate to that of the corresponding printing ink.

The so-called oil-soluble dye preferably applicable to the invention means herein an organic dye that has a water-solubility [g/100 g of water] at 20° C. (that is the weight of a material soluble to 100 g of water) of not higher than $1 \times 10^{-2}$. The typical compounds thereof include, for example, anthraquinone type compounds and azo type compounds.

In the oil-soluble dyes relating to the invention and when the maximum absorption wavelength thereof is not shorter than 400 nm, the molar absorptivity coefficient is, preferably, not less than 5000 and, particularly, not less than 20000 (in the case of making use of a chloroform solvent).

The oil-soluble dye preferably applicable to the photosensitive materials of the invention is used in an amount within the range of, preferably, 0.01 to 10 mg/m² and, particularly, 0.05 to 5 mg/m².

The oil-soluble dyes applicable to the invention may be used in any photographic emulsion layers. However, the dyes are preferable to be added in a non-photosensitive layer other than coupler-containing layers.

The particularly preferable method for making use of the oil-soluble dyes of the invention is to contain an oil-soluble dye in an amount within the range of 0.05 to 5 mg/m² into a non-photosensitive layer other than coupler-containing layers, provided that the molecular absorptivity coefficient of the dye is not less than 20000 when the maximum absorption wavelength thereof is not shorter than 400 nm.

The oil-soluble dyes preferably applicable to the invention include, for example, Compounds 1 through 27 given in JP OPI Publication No. 2-842, pp.(8)–(9), and Compounds 1 through 27 given in JP Application No. 4-226014/1992, paragraphs 0116–0119. However, the invention shall not be limited thereto.

It is preferable to contain a fluorescent whitening agent in the photosensitive materials of the invention and/or the processing solutions for processing the photosensitive materials thereof.

The fluorescent whitening agents preferably applicable thereto include, for example, those of the stilbene type, triazine type, imidazolone type, pyrazoline type, triazole type, coumarin type, acetylene type, oxazole type or oxadiazole type. These fluorescent whitening agents are described in, for example, U.S. Pat. Nos. 2,571,706, 2,581,057, 2,618,636, 2,702,296, 2,702,296, 2,713,054, 2,715,630, 2,723,197, 3,269,840, 3,513,102, 3,615,544, 3,615,547, 3,684,729, 3,788,854 and 3,789,012; British Patent Nos. 669,590, 672,803 and 712,764; Dutch Patent No. 74,109; German Patent no. 911,368; German (OLS) Patent No. 2,525,680; and JP Examined Publication No. 34-7127/1959. These compounds may be of the water-soluble, and they may also be used in the form of a dispersed matter.

A series of development processes can be performed continuously with a developer, a bleach-fixer and a stabilizer each for processing the silver halide photographic photosensitive materials of the invention, while replenishing a developer replenisher, a bleacher replenisher, a fixer replenisher, a bleach-fixer replenisher, a stabilizer replenisher and so forth thereto. In the invention, the effects of the invention can be more effectively displayed when the amount of the developer replenisher used therein is not more than 700 cc and preferably not more than 500 cc, per sq.meter of a photosensitive material to be processed. It is also similar to the case of the developer when making use of the other processing solutions than the developer that is, the effects of the invention can be more effectively displayed when the amounts of the replenishers used therein are each not more than 700 cc and preferably not more than 500 cc, per sq.meter of a photosensitive material to be processed.

In the invention, there uses a liquid type UV absorbent that is in the form of a liquid at an ordinary temperature. The expression, "those in the form of a liquid at an ordinary temperature", stated herein means, as defined in 'An Encyclopaedia of Chemistry' (1963), Kyoritsu Publishing Co., those having an amorphous form, a fluidity and an almost fixed volume. There is, accordingly, no special limitation to the melting points thereof, provided that the above-mentioned characteristics can be satisfied. However, it is preferable when the subject compound has a melting point of not higher than 30° C. and, particularly, not higher than 15° C.

The liquid type UV absorbents of the invention may take any structures, provided, the above-mentioned requirements can be satisfied. However, from the viewpoint of the light fastness of a UV absorbent in itself, 2-(2-hydroxyphenyl) benzotriazole type compounds are preferably used. The UV absorbents preferably applicable to the invention include, for example, Compounds UV-1L through UV-27L given in JP Application No. 4-107780, Paragraphs 0027–0028. There is, however, no special limitation thereto.

The above-mentioned UV absorbents relating to the invention may be added in any amount. However, they may be added in an amount by weight within the range of 0.1 to 300% preferably 1 to 200% and, particularly 5 to 100% to the binder of a photographic component layer subject to contain the absorbent. It is also preferable to coat the absorbent in an amount within the range of, preferably 0.01 to 100 mg/100cm$^2$, further 0.1 to 50 mg/100cm$^2$ and, particularly 0.5 to 30 mg/100cm$^2$.

The layers for containing the liquid type UV absorbents of the invention may be any one of the photographic component layers of the invention. However, it is preferable that; the photographic component layer arranged to a position farther than the photosensitive silver halide emulsion layer farthest from the support of a photosensitive material; such photographic component layer arranged thereto is to contain at least 60% by weight and preferably at least 80% by weight of the whole UV absorbent contained in the photosensitive material.

In the invention, at least one of non-photosensitive layers contains a compound represented by the following Formula [H-I].

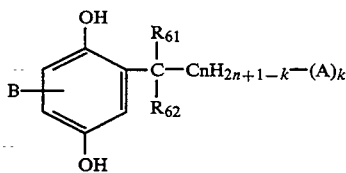

Formula [H-I]

In Formula [H-I], $R_{61}$ and $R_{62}$ represent each an alkyl group having 1 to 5 carbon atoms, such as a group of methyl, ethyl, propyl, i-propyl, butyl, sec-butyl, pentyl and neopentyl; n is an integer of 1 to 20 and preferably 2 to 15; k is an integer of 1 or 2; A represents —CO—$XR_{63}$ (wherein X represents —O— or —N($R_{64}$)—; $R_{63}$ represents a hydrogen atom or a group of alkyl, alkenyl, cycloalkyl or aryl; and $R_{64}$ represents a hydrogen atom or a group of alkyl or aryl), —OY (wherein Y represents $R_{63}$ or —CO—$R_{63}$ in which $R_{63}$ is synonymous with the above-denoted $R_{63}$), —N($R_{64}$)$R_{65}$ (wherein $R_{64}$ is synonymous with the above-denoted $R_{64}$, $R_{65}$ represents a hydrogen atom of a group of alkyl, aryl or —CO—$R_{63}$ in which $R_{63}$ is synonymous with the above-denoted $R_{63}$), —PO—(O$R_{63}$)—{(O)$_l R_{66}$} (wherein l is an integer of 0 or 1, $R_{63}$ is synonymous with the above-denoted $R_{63}$, and $R_{66}$ represents a hydrogen atom or a group of alkyl, cycloalkyl, alkenyl or aryl), or a cyano group; and B represents a group of alkyl, alkenyl, cycloalkyl, aryl, heterocyclic or the following group,

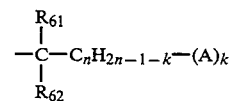

(wherein $R_{61}$, $R_{62}$, n, k and A are each synonymous with the same denoted above.); provided that the alkyl, alkenyl, cycloalkyl and aryl groups each represented by $R_{63}$, the alkyl and aryl groups each represented by $R_{64}$, the alkyl and aryl groups each represented by $R_{65}$, the alkyl, cycloalkyl, alkenyl and aryl groups each represented by $R_{66}$, the alkyl, alkenyl, cycloalkyl, aryl and heterocyclic groups each represented by B; such groups include those having substituents, respectively. The substituents to the above-given alkyl groups include, for example, a halogen atom and a group of cycloalkyl, alkenyl, aryl, alkoxy, aryloxy, acyl, heterocyclic or cyano. The substituents to the above-given alkenyl, cycloalkyl, aryl and heterocyclic groups include, for example, a halogen atom and a group of alkyl, cycloalkyl, alkenyl, aryl, alkoxy, aryloxy, acyl, heterocyclic or cyano.

The alkyl groups represented by $R_{63}$, $R_{64}$, $R_{65}$, $R_{66}$ and B include, for example, a group of methyl, ethyl, propyl, butyl, sec-butyl, hexyl, 2-ethyl-hexyl, dodecyl, hexadecyl and benzyl. The alkenyl groups represented by $R_{63}$, $R_{66}$ and B include, for example, an aryl group. The cycloalkyl groups represented by $R_{63}$, $R_{66}$ and B include, for example, a cycloalkyl group. The aryl groups represented by $R_{63}$, $R_{64}$, $R_{65}$, $R_{66}$ and B include, for example, a group of phenyl or naphthyl.

The compounds represented by the foregoing Formula [H-I] include, preferably, the compounds represented by the following Formula [H-I-1] or the precursors thereof.

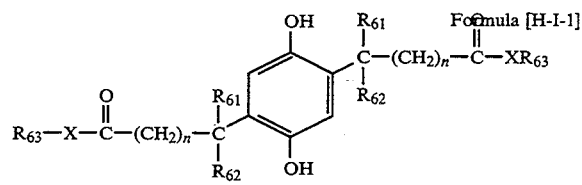

Formula [H-I-1]

wherein $R_{61}$, $R_{62}$, $R_{63}$, X and n are synonymous with $R_{61}$, $R_{62}$, $R_{63}$, X and n each denoted in the foregoing Formula [H-I], respectively.

Now, the typical examples of the compounds represented by Formula [H-I], which are applicable to the invention, will be given below. It is, however, to be understood that the invention shall not be limited thereto.

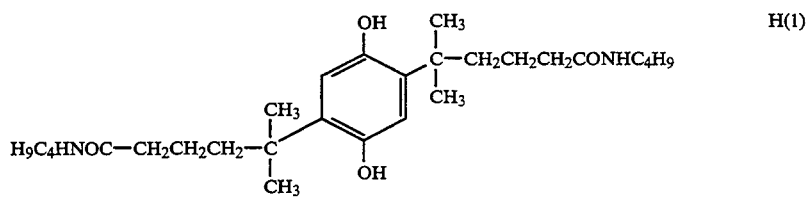 H(1)
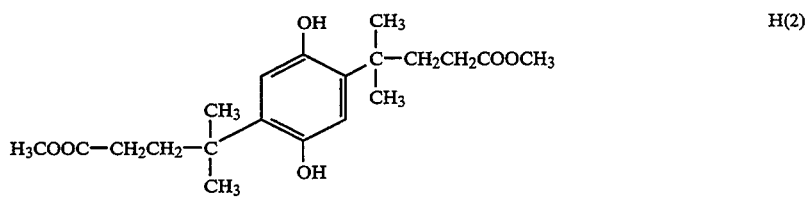 H(2)
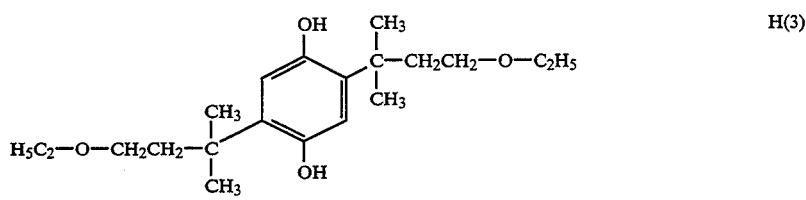 H(3)
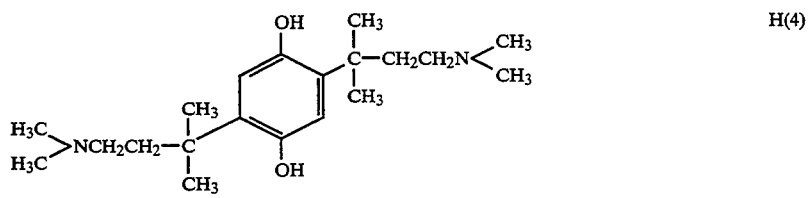 H(4)
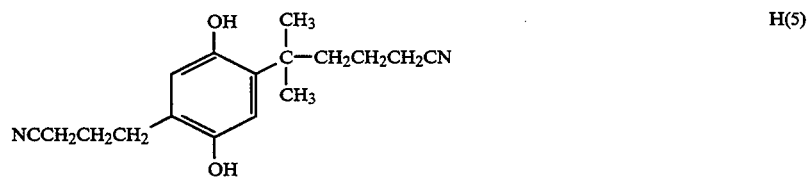 H(5)
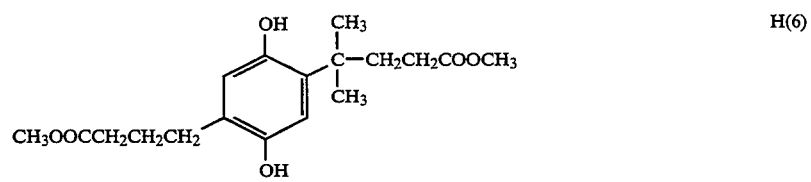 H(6)
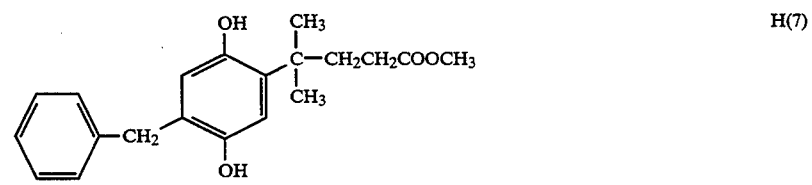 H(7)
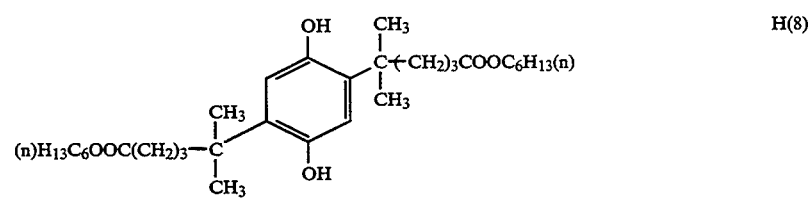 H(8)

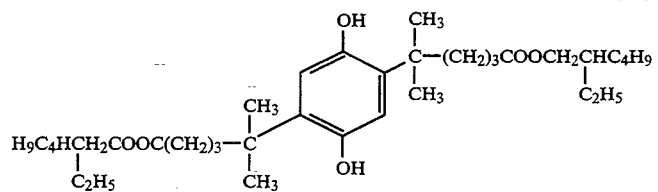 H(9)
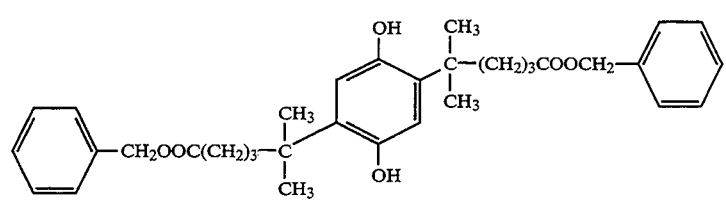 H(10)
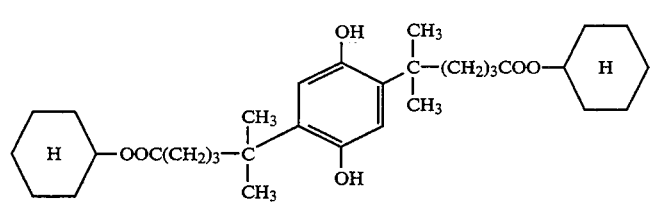 H(11)
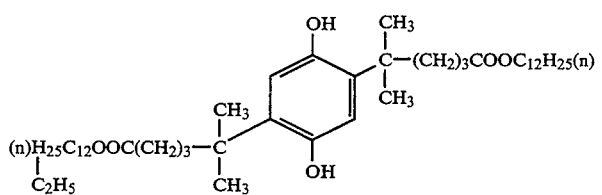 H(12)
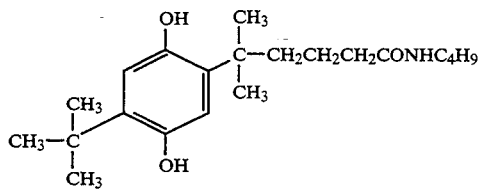 H(13)
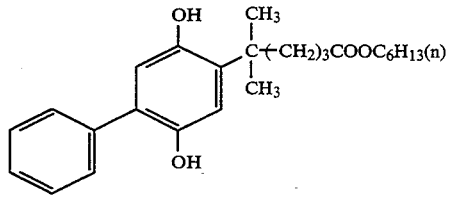 H(14)
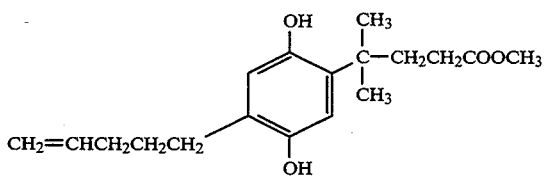 H(15)
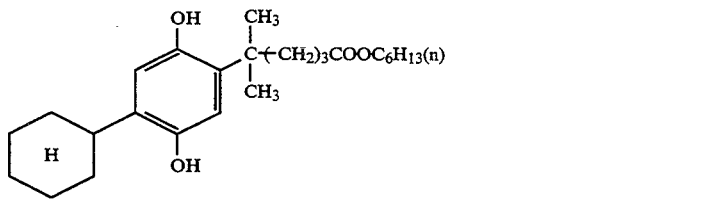 H(16)

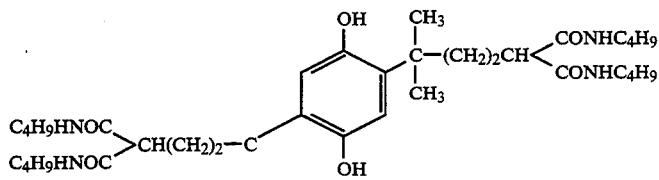

H(17)

The compounds represented by the above-given Formula [H-I] (hereinafter referred to as the compounds represented by Formula [H-I] relating to the invention) basically include the compounds given in JP OPI Publication No. 58-24141/1983, and the process for synthesizing them can be referred to the same JP OPI Publication.

The compounds represented by Formula [H-I] relating to the invention can be contained in at least one layer selected from the group consisting of non-photosensitive layers (such as an intermediate layer, a protective layer, a sublayer and a filter layer) of a silver halide photographic photosensitive material. There is no special limitation to the amounts of the compounds to be added in such a layer as mentioned above. However, they may be added in an amount preferably within the range of $1 \times 10^{-6}$ to $1 \times 10^{-2}$ mols/m$^2$.

The compounds represented by Formula [H-I] relating to the invention can be used independently or in combination.

The supports applicable to the light sensitive materials of the invention include, for example, those given in the foregoing RD17643, p.28 and RD18716, p.647. The suitable supports are made of a polymer film, a sheet of paper, or the like. They may also be treated to enhance the adhesive property, antistatic property and so forth.

EXAMPLES

The invention will be detailed with reference to the following examples. However, the invention shall not be limited thereto.

EXAMPLE 1

(Preparation of Emulsion EM-1)

A cubic silver chlorobromide core emulsion having a grain size of 30 μm was prepared, in a controlled double-jet precipitation method, by adding at the same time an aqueous solution containing ammonia and silver nitrate and an aqueous solution containing potassium bromide and sodium chloride (in a mol ratio of KBr:NaCl=95:5), while controlling an aqueous ossein gelatin containing solution to be kept at 40° C. At that time, the pH and pAg thereof were so controlled as to form the cubes as the grain configuration thereof. To the resulting core emulsion, another aqueous solution containing ammonia and silver nitrate, and another aqueous solution containing potassium bromide and sodium chloride (in a mol ratio of KBr:NaCl=40:60) were further added at the same time, in a controlled double-jet precipitation method, so that the shells were grown up to have an average grain size of 0.42 μm. At that time, the pH and pAg thereof were so controlled as to form the cubes as the grain configuration thereof.

After completing a washing treatment to remove the resulting water-soluble salts, gelatin was then added, so that Emulsion EM-1 could be prepared. The resulting emulsion EM-1 was proved to have a distribution range of 8%.

(Preparation of Emulsion EM-2)

A cubic silver chlorobromide core emulsion having a grain size of 0.18 μm was prepared, in a controlled double-jet precipitation method, by adding at the same time an aqueous solution containing ammonia and silver nitrate, and an aqueous solution containing potassium bromide and sodium chloride (in a mol ratio of KBr:NaCl=95:5), while controlling an aqueous ossein gelatin containing solution to be kept at 40° C. At that time, the pH and pAg thereof were so controlled as to form the cubes as the grain configuration thereof. To the resulting core emulsion, another aqueous solution containing ammonia and silver nitrate, and another aqueous solution containing potassium bromide and sodium chloride (in a mol ratio of KBr:NaCl=40:60) were further added at the same time, in a controlled double-jet precipitation method, so that the shells were grown up to have an average grain size of 0.25 μm. At that time, the pH and pAg thereof were so controlled as to form the cubes as the grain configuration thereof.

After completing a washing treatment to remove the resulting water-soluble salts, gelatin was then added, so that Emulsion EM-2 could be prepared. The resulting emulsion EM-2 was proved to have a distribution range of 8%.

(Preparation of Blue-sensitive Emulsion EM-B)

Sensitizing dye D-1 was added to EM-1 to make a color sensitization, and T-1 was then added in an amount of 600 mg per mol of silver, so that blue-sensitive emulsion EM-B could be prepared.

(Preparation of Green-sensitive Emulsion EM-G)

A green-sensitive emulsion EM-G was prepared in the same procedures as in the blue-sensitive emulsion, except that sensitizing dye D-2 was added to EM-1.

(Preparation of R-sensitive Emulsion EM-R)

A red-sensitive emulsion EM-R was prepared in the same procedures as in the blue-sensitive emulsion, except that sensitizing dyes D-3 and D-4 were each added to EM-2.

(Preparation of Panchromatically sensitive Emulsion EM-P)

A panchromatically sensitive emulsion EM-P was prepared in the same procedures as in the blue-sensitive emulsion, except that sensitizing dyes D-1, D-2, D-3 and D-4 were each added to EM-1.

(Preparation of Infrared sensitive Emulsion EM-I)

An infrared sensitive emulsion EM-I was prepared in the same procedures as in the blue-sensitive emulsion, except that sensitizing dyes D-5 was added to EM-1.

T-1: 4-hydroxy-6-methyl-1,3,3a,7-tetrazaindene

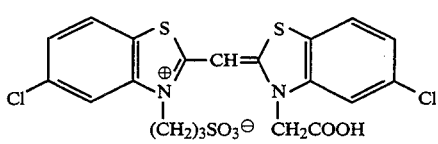
D-1

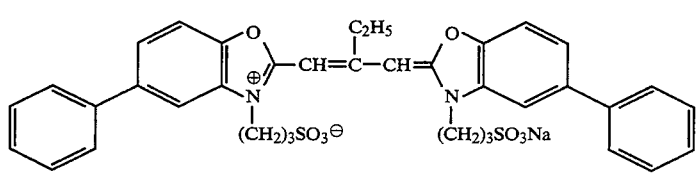
D-2

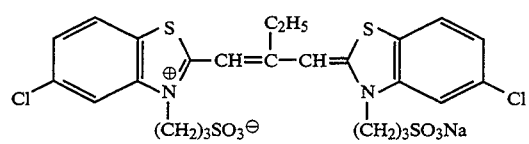
D-3

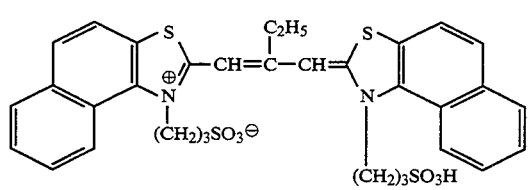
D-4

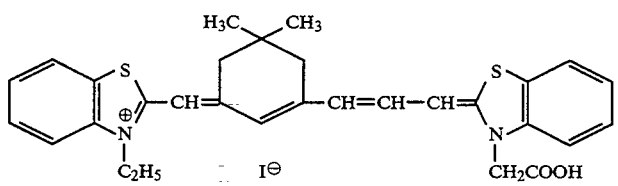
D-5

A color photographic photosensitive material having the following composition was prepared by making use of the above-mentioned EM-B, EM-G, EM-R and EM-P.

The following Sample 1 was prepared in the following manner; Over the front surface of a support laminated with polyethylene on both sides thereof, Layer 1 through Layer 10 were coated and, over the back surface thereof, Layer 11 was coated. The compositions of the layers were as follows. In addition, coating aids, SA-1 and SA-2, and layer hardeners H-1 and H-2, were each used therein.

In preparing the coating solutions, the panchromatic emulsion EM-P contained in Layers 3, 5 and 9 were mixed into the coating solution separately prepared by eliminating the panchromatic emulsions. Immediately after mixing them, the resulting coating solution was coated. The gelatin applied thereto was that having a transmittance improved by adding aqueous hydrogen peroxide thereto in the late stage of an ossein-liming treatment so as to make the coloration of the ossein lower, and then to extract the gelatin.

SA-1: Sodium sulfosuccinic di(2-ethylhexyl) ester
SA-2: Sodium sulfosuccinic di(2,2,3,3,4,4,5,5-octafluoropentyl) ester
H-1: Sodium 2,4-dichloro-6-hydroxy-s-triazine
H-2: Tetrakis (vinyl sulfonylmethyl) methane

| Layer | Composition | Coating weight (g/m$^2$) |
|---|---|---|
| Layer 10 | (a UV absorbing layer) | |
| | Gelatin | 0.78 |
| | UV absorbent (UV-1) | 0.065 |
| | UV absorbent (UV-2) | 0.120 |
| | UV absorbent (UV-3) | 0.160 |
| | Oil-soluble dye 1 | 0.5 × 10$^{-3}$ |
| | Oil-soluble dye 2 | 0.5 × 10$^{-3}$ |
| | Solvent (SO-2) | 0.1 |
| | Silica matting agent | 0.03 |
| Layer 9 | (a blue-sensitive layer) | |
| | Gelatin | 1.43 |
| | Blue-sensitive emulsion EM-B | 0.4 |
| | | (in Ag coating weight) |
| | Panchromatic emulsion EM-P | 0.10 |
| | | (in silver coating weight) |
| | Yellow coupler (YC-1) | 0.82 |
| | Antistaining agent (AS-2) | 0.025 |
| | Solvent (SO-1) | 0.82 |
| | Inhibitors (ST-1, ST-2, T-1) | 0.005 |
| Layer 8 | (an intermediate layer) | |
| | Gelatin | 0.54 |
| | Color mixture preventive, (AS-1, AS-3, AS-4) | 0.055 |
| | Solvent (SO-2) | 0.072 |
| | Anti-irradiation dye (AI-3) | 0.03 |
| Layer 7 | (a yellow colloidal layer) | |
| | Gelatin | 0.42 |
| | Yellow colloidal silver | 0.03 |
| | Color mixture preventive, (AS-1, AS-3, AS-4 in equivalency) | 0.04 |
| | Solvent (SO-2) | 0.049 |

| Layer | Composition | Coating weight (g/m²) |
|---|---|---|
| | Polyvinyl pyrrolidone (PVP) | 0.047 |
| Layer 6 | (an intermediate layer) | |
| | Gelatin | 0.54 |
| | Color mixture preventive, (AS-1, AS-3, AS-4 in equivalency) | 0.055 |
| | Solvent (SO-2) | 0.072 |
| Layer 5 | (a green-sensitive layer) | |
| | Gelatin | 1.43 |
| | Green-sensitive emulsion EM-G | 0.40 (in silver coating weight) |
| | Panchromatic emulsion EM-P | 0.10 (in silver coating weight) |
| | Magenta coupler (MC-1) | 0.25 |
| | Yellow coupler (YC-2) | 0.06 |
| | Antistaining agent (AS-2) | 0.019 |
| | Solvent (SO-1) | 0.31 |
| | Inhibitors (ST-1, ST-2, T-1) | 0.005 |
| Layer 4 | (an intermediate layer) | |
| | Gelatin | 0.75 |
| | Color mixture preventive, (AS-1, AS-3, AS-4 in equivalency) | 0.055 |
| | Solvent (SO-2) | 0.072 |
| | Anti-irradiation dye (AI-1) | 0.03 |
| | Anti-irradiation dye (AI-2) | 0.03 |
| Layer 3 | (a red-sensitive layer) | |
| | Gelatin | 1.38 |
| | Red-sensitive emulsion EM-R | 0.24 (in silver coating weight) |
| | Panchromatic emulsion EM-P | 0.06 (in silver-coating weight) |
| | Cyan coupler (CC-2) | 0.44 |
| | Solvent (SO-1) | 0.31 |
| | Antistaining agent (AS-2) | 0.015 |
| | Inhibitors (ST-1, ST-2, T-1) | 0.003 |
| Layer 2 | (an intermediate layer) | |
| | Gelatin | 0.54 |
| | Color mixture preventive, (AS-1, AS-3, AS-4 in equivalency) | 0.055 |
| | Solvent (SO-2) | 0.072 |
| Layer 1 | (an HC layer) | |
| | Gelatin | 0.54 |
| | Black colloidal silver | 0.08 |
| | Polyvinyl pyrrolidone (PVP) | 0.03 |
| Layer 11 | (a back-side layer) | |
| | Gelatin | 6.00 |
| | Silica matting agent | 0.65 |

The above-given silver coating weights are indicated by converting them into the silver contents.

Next, Sample 2 having the following compositions was prepared in the same manner as in Sample 1, except that the above-mentioned EM-B, EM-G, EM-R and EM-I were each used therein.

| Layer | Composition | Coating weight (g/m²) |
|---|---|---|
| Layer 12 | (a UV absorbing layer) | |
| | Gelatin | 0.78 |
| | UV absorbent (UV-1) | 0.065 |
| | UV absorbent (UV-2) | 0.120 |
| | UV absorbent (UV-3) | 0.160 |
| | Solvent (SO-2) | 0.1 |
| | Silica matting agent | 0.03 |
| Layer 11 | (a blue-sensitive layer) | |
| | Gelatin | 1.14 |
| | Blue-sensitive emulsion EM-B | 0.4 (in Ag coating weight) |
| | Yellow coupler (YC-1) | 0.656 |
| | Antistaining agent (AS-2) | 0.02 |
| | Solvent (SO-1) | 0.656 |
| | Inhibitors (ST-1, ST-2, T-1) | |
| Layer 10 | (an intermediate layer) | |
| | Gelatin | 0.54 |
| | Color mixture preventive, (AS-1, AS-3, AS-4 in equivalency) | 0.055 |
| | Solvent (SO-2) | 0.072 |
| | Anti-irradiation dye (AI-3) | 0.03 |
| Layer 9 | (a yellow colloidal layer) | |
| | Gelatin | 0.42 |
| | Yellow colloidal silver | 0.1 |
| | Color mixture preventive, (AS-1, AS-3, AS-4 in equivalency) | 0.05 |
| | Solvent (SO-2) | 0.049 |
| | Polyvinyl pyrrolidone (PVP) | 0.047 |
| Layer 8 | (an intermediate layer) | |
| | Gelatin | 0.54 |
| | Color mixture preventive, (AS-1, AS-3, AS-4 in equivalency) | 0.055 |
| | Solvent (SO-2) | 0.072 |
| Layer 7 | (a green-sensitive layer) | |
| | Gelatin | 1.14 |
| | Green-sensitive emulsion EM-G | 0.40 (in silver coating weight) |
| | Magenta coupler (MC-1) | 0.20 |
| | Yellow coupler (YC-2) | 0.05 |
| | Antistaining agent (AS-2) | 0.0152 |
| | Solvent (SO-1) | 0.248 |
| | Inhibitors (ST-1, ST-2, T-1) | |
| Layer 6 | (an intermediate layer) | |
| | Gelatin | 0.75 |
| | Color mixture preventive, (AS-1, AS-3, AS-4 in equivalency) | 0.055 |
| | Solvent (SO-2) | 0.072 |
| Layer 5: | (A red-sensitive layer) | |
| | Gelatin | 1.10 |
| | Red-sensitive emulsion EM-R | 0.24 (in silver coating weight) |
| | Cyan coupler (CC-2) | 0.352 |
| | Solvent (SO-1) | 0.248 |
| | Antistaining agent (AS-2) | 0.012 |
| | Inhibitors (ST-1, ST-2, T-1) | |
| Layer 4: | (An intermediate layer) | |
| | Gelatin | 0.75 |
| | Color mixture preventives, (AS-1, AS-3, AS-4 each in an equivalent weight) | 0.055 |
| | Solvent (SO-2) | 0.072 |
| Layer 3: | (An infrared-sensitive layer) | |
| | Gelatin | 1.05 |
| | Infrared-sensitive emulsion EM-I | 0.30 (in silver coating weight) |
| | Yellow coupler (YC-1) | 0.21 |
| | Magenta coupler (MC-1) | 0.063 |
| | Cyan coupler (CC-1) | 0.110 |
| | Antistaining agent (AS-2) | 0.019 |
| | Solvent (SO-1) | 0.615 |
| Layer 2: | (An intermediate layer) | |
| | Gelatin | 0.54 |
| | Color mixture preventives, (AS-1, AS-3, AS-4 in an equivalent weight) | 0.055 |
| | Solvent (SO-2) | 0.072 |
| Layer 1: | (An HC layer) | |
| | Gelatin | 0.54 |
| | Polyvinyl pyrrolidone (PVP) | 0.03 |
| Layer 13: | (A backing layer) | |
| | Gelatin | 6.00 |
| | Silica matting agent | 0.65 |

The additives added to each of the layers were as follows.

SO-1: Trioctyl phosphate
SO2: Dioctyl phthalate
AS-1: 2,5-di-t-octyl hydroquinone
AS-2: 2,5-di-t-butyl hydroquinone AS-3: 2,5-di-(1,1-dimethyl-4-hexyloxy carbonyl butyl) hydroquinone AS-4: A mixture of 2,5-di-sec-dodecyl hydroquinone, 2,5-di-sec-tetradecyl hydroquinone and 2-secdodecyl-5-tetradecyl hydroquinone ST-1: 1-(3-acetamidophenyl)-5-mercaptotetrazole ST-2: N-benzyladenine As shown in the following Table 1, the samples were each prepared by adding the antihalation layer and/or the water-soluble dyes to each Layer 2 (An intermediate) layer of the above-mentioned resulting samples 1 and 2, respectively. The samples are herein named Samples 1A through 1E and 2A through 2E, respectively.

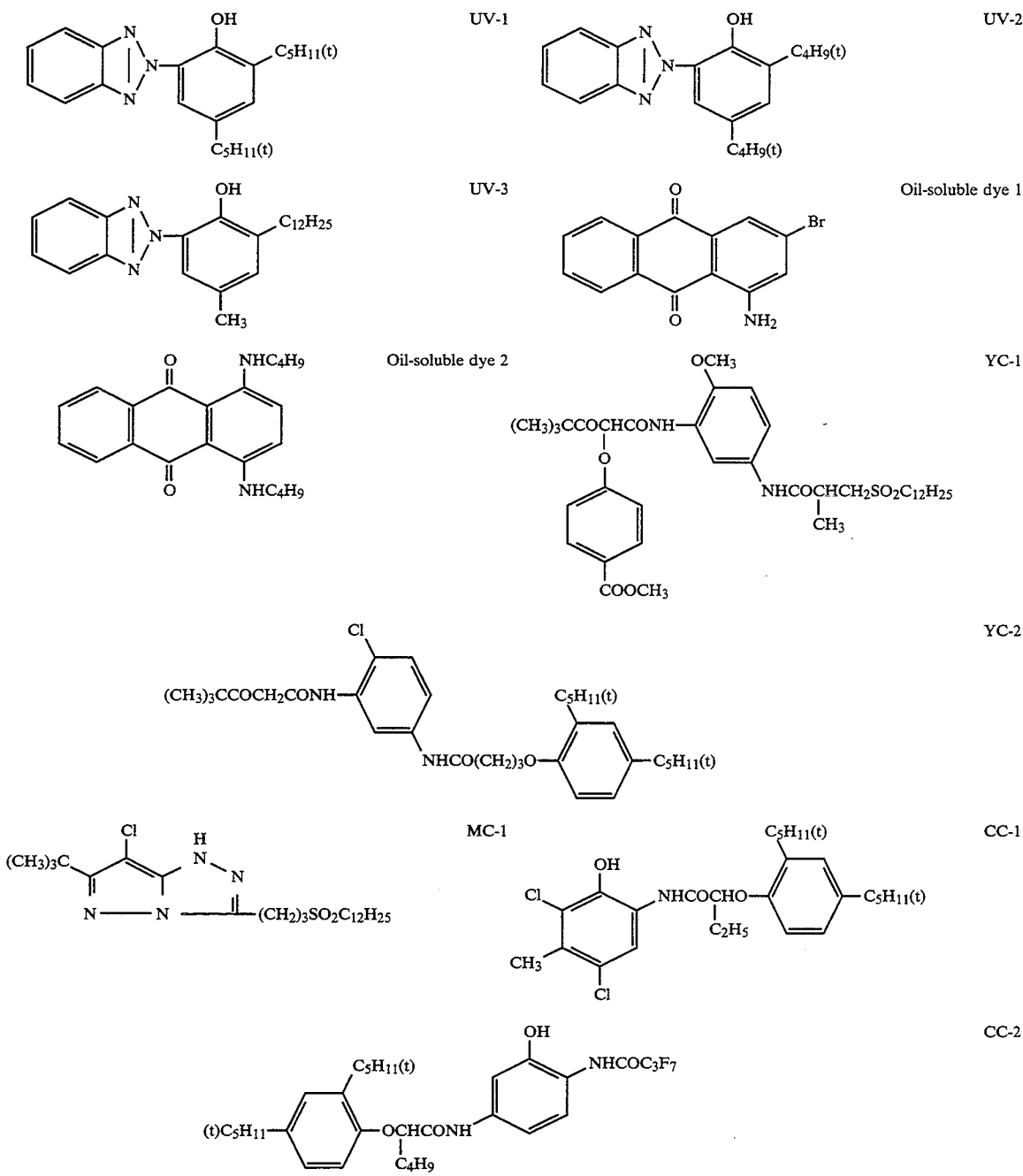

TABLE 1

| Sample No. | Lowermost layer, Antihalation layer | Water-soluble dye (g/m$^2$) | | | Reflection *1 density prior to developments | | |
|---|---|---|---|---|---|---|---|
| | | Yellow | Magenta | Cyan | 450 nm | 550 nm | 700 nm |
| 1A (Comparison) | Not arranged | Not arranged | Not arranged | Not arranged | 0.19 | 0.63 | 0.66 |
| 1B (Invention) | Arranged*2 | Not arranged | Not arranged | Not arranged | 1.04 | 1.04 | 1.02 |

TABLE 1-continued

| Sample No. | Lowermost layer, Antihalation layer | Water-soluble dye (g/m²) | | | Reflection *1 density prior to developments | | |
|---|---|---|---|---|---|---|---|
| | | Yellow | Magenta | Cyan | 450 nm | 550 nm | 700 nm |
| 1C (Invention) | Not arranged | AIY-13 (0.05) | AIM-3 (0.03) | AIC-2 (0.06) | 1.09 | 1.05 | 1.02 |
| 1D (Invention) | Not arranged | AIY-13 (0.05) | AIM-4 (0.04) | AIC-3 (0.06) | 1.09 | 1.06 | 1.02 |
| 1E (Invention) | Arranged*3 | AIY-15 (0.02) | AIM-4 (0.02) | AIC-3 (0.03) | 1.05 | 1.05 | 1.04 |
| 2A (Comparison) | Not arranged | Not arranged | Not arranged | Not arranged | 0.20 | 0.60 | 0.61 |
| 2B (Invention) | Arranged | Not arranged | Not arranged | Not arranged | 1.03 | 1.05 | 1.01 |
| 2C (Invention) | Not Arranged | AIY-13 (0.05) | AIM-3 (0.03) | AIC-2 (0.06) | 1.09 | 1.05 | 1.02 |
| 2D (Invention) | Not arranged | AIY-13 (0.05) | AIW4 (0.04) | AIC-3 (0.06) | 1.08 | 1.05 | 1.04 |
| 2E (Invention) | Arranged | AIY-15 (0.02) | AIM-4 (0.02) | AIC-3 (0.03) | 1.05 | 1.04 | 1.05 |

*1 The reflection densities were each measured by a color analyzer, Model 607 manufactured by Hitachi, Ltd.
*2 Through the gelatin layers, black colloidal silver was contained in an amount of 0.12 g/m² in terms of silver content.
*3 Through the gelatin layers, black colloidal silver was contained in an amount of 0.07 g/m² in terms of silver content.

The resulting Samples 1A through 1E were each brought into close contact with the black and cyan printers of a halftone dot original document and were then exposed to light under the following exposure conditions-1, respectively. Next, the black and magenta printers were each brought into close contact with the samples and were then exposed to light under the following exposure conditions-2, respectively. Finally, the black and yellow printers were each brought into close contact with the samples and were then exposed to light under the following exposure conditions-3, respectively.

Samples 2A through 2E were each exposed to light under the exposure conditions-1 through -3 in order, in the same manner as in Samples 1A through 1E. The exposed Samples were each brought into close contact with only a black printer of the original document and were then exposed to light under the following exposure conditions-4.

The exposed photosensitive materials were each processed in the following development steps and the resulting dye image densities were each measured. Then, the comparisons were made between the resulting densities and the densities of the proof prints obtained from the four color printers of the above-mentioned halftone dot original document. And, the image qualities of the resulting halftone dot images and the color approximations thereof were evaluated. When the densities were measured, a densitometer, Model PD-65 manufactured by Konica Corp. was used.

The resulting halftone dot image qualities were evaluated in the following criteria.

○ . . . Color proof having the halftone dot image quality coincident with the subject printed matter;

Δ . . . Color proof having the color balance shifted from the subject printed matter;

X . . . Color proof having the small dots battered more than those of the subject printed matter; and XX . . . Color proof having the small and large dots each battered more than those of the subject printed matter.

The color approximations were each evaluated by the following grades; ○ (Color was extremely approximate to the subject printed matter); Δ (Color was not approximate to the subject printed matter in the case of some color hue); and X (Color hues were different from those of the subject printed matter).

The results obtained will be collectively shown in the following Table 2.

(Exposure conditions-1)

Each of the photosensitive materials was exposed to white light through a red filter (Wratten No. 26) and an ND filter. At that time, the ND filter density was adjusted to provide the minimum exposure quantity obtained when the red light density was minimized after processing the photosensitive materials, and the exposures were each made for 0.5 seconds in the above-mentioned minimum exposure quantity.

(Exposure conditions-2)

Each of the photosensitive materials was exposed to white light through a green filter (Wratten No. 58) and an ND filter. At that time, the ND filter density was adjusted to provide the minimum exposure quantity obtained when the green light density was minimized after processing the photosensitive materials, and the exposures were each made for 0.5 seconds in the above-mentioned minimum exposure quantity.

(Exposure conditions-3)

Each of the photosensitive materials was exposed to white light through a blue filter (Wratten No. 47B) and an ND filter. At that time, the ND filter density was adjusted to provide the minimum exposure quantity obtained when the blue light density was minimized after processing the photosensitive materials, and the exposures were each made for 0.5 seconds in the above-mentioned minimum exposure quantity.

(Exposure conditions-4)

Each of the photosensitive materials was exposed to light under the above-mentioned exposure conditions-1 through -3 in order, and the resulting exposed samples were then exposed to tungsten light through an infrared filter and an ND filter. At that time, the ND filter density was adjusted to provide the minimum exposure quantity obtained when the visible light density was minimized after processing the samples, and the exposures were made each for 0.5 seconds in the above-mentioned minimum exposure quantity. Only the exposure to be made to tungsten light through the infrared filter was regarded as Exposure conditions-4. In this case, a daylight fluorescent lamp was used as the light source for each of the Exposure conditions-1 through -3.

The following development steps were carried out, wherein, however, the fogging exposure was made uniformly on overall surfaces of the photosensitive materials through the 3 mm-thick developer layer while dipping them in a developer.

| Processing step 1 | Temperature | Time |
|---|---|---|
| Dipping (in a developer) | 37° C. | 12 sec. |
| Fogging exposure | — | 12 sec. (at 1 lux) |
| Developing | 37° C. | 95 sec. |
| Bleach-fixing | 35° C. | 45 sec. |
| Stabilizing | 25~30° C. | 90 sec. |
| Drying | 60~85° C. | 40 sec. |
| Compositions of the processing solutions | | |
| (Color developer) | | |
| Benzyl alcohol | | 15 cc |
| Cerious sulfate | | 0.015 g |
| Ethylene glycol | | 8.0 cc |
| Potassium sulfite | | 2.5 g |
| Potassium bromide | | 0.6 g |
| Sodium chloride | | 0.2 g |
| Potassium carbonate | | 25.0 g |
| T-1 | | 0.1 g |
| Hydroxylamine sulfate | | 5.0 g |
| Sodium diethylenetriamine pentaacetate | | 2.0 g |
| 4-amino-N-ethyl-N-($\beta$-hydroxyethyl) aniline sulfate | | 4.5 g |
| Fluorescent whitening agent, (a 4,4'-diaminostilbene disulfonic acid derivative) | | 1.0 g |
| Potassium hydroxide | | 2.0 g |
| Diethylene glycol | | 15.0 cc |
| Add water to make in total of | | 1 liter |
| Adjust pH to be | | pH 10.15 |
| (Bleach-fixer) | | |
| Ferric ammonium diethylenetriamine pentaacetate | | 90.0 g |
| Diethylenetriamine pentaacetic acid | | 3.0 g |
| Ammonium thiosulfate, (in an aqueous 70% solution) | | 180 cc |
| Ammonium sulfite, (in an aqueous 40% solution) | | 27.5 cc |
| 3-mercapto-1,2,4-triazole | | 0.15 g |
| Adjust pH with potassium carbonate or glacial acetic acid to be | | pH 7.1 |
| Add water to make in total of | | 1 liter |
| (Stabilizer) | | |
| o-phenylphenol | | 0.3 g |
| Potassium sulfite, (in an aqueous 50% solution) | | 12 cc |
| Ethylene glycol | | 10 g |
| 1-hydroxyethylidene-1,1-diphosphonic acid | | 2.5 g |
| Bismuth chloride | | 0.2 g |
| Zinc sulfate, heptahydrate | | 0.7 g |
| Ammonium hydroxide, (in an aqueous 28% solution) | | 2.0 g |
| Polyvinyl pyrrolidone (K-17) | | 0.2 g |
| Fluorescent whitening agent, (a 4,4'-diaminostilbene diphosphonic acid derivative) | | 2.0 g |
| Add water to make in total of | | 1 liter |
| Adjust pH with ammonium hydroxide or sulfuric acid to be | | pH 7.5 |

The stabilizing treatment was carried out in a double-tank type counter-current system.

TABLE 2

| Sample No. | Halftone dot quality in magenta | Color approximation in magenta[*4] | Halftone dot quality in black | Color approximation in black[*5] | Operability[*6] |
|---|---|---|---|---|---|
| 1A (Comparison) | X | ○ | X | ○ | ○ |
| 1B (Invention) | ○ | ○ | ○ | ○ | ○ |
| 1C (Invention) | ○ | ○ | ○ | ○ | ○ |
| 1D (Invention) | ○ | ○ | ○ | ○ | ○ |
| 1E (Invention) | ○ | ○ | ○ | ○ | ○ |
| 2A (Comparison) | X | X | X | X | X |
| 2B (Comparison) | Δ | Δ | Δ | Δ | X |
| 2C (Comparison) | Δ | Δ | Δ | Δ | X |
| 2D (Comparison) | Δ | Δ | Δ | Δ | X |
| 2E (Comparison) | ○ | Δ | ○ | Δ | X |

[*4]Shows the approximation of the color hues of the halftone dot image formed of the color coupler to the subject printed matter;
[*5]Shows the approximation of the color hues of the halftone dot black image; and
[*6]Judged in terms of the numbers of exposures. The operability is a serious problem for practical use.

As is obvious from the results shown in Table 2, Samples 1B through 1E of the invention displayed the excellent results of the halftone dot image quality (i.e., the halftone dot reproducibility) and the color hues. It was also proved that the operability left no room for any further improvements, because the exposures can be made only three times in the invention.

What is claimed is:

1. A silver halide positive color proof photographic light-sensitive material comprising a support and provided thereon, a first silver halide light-sensitive emulsion layer, a second silver halide light-sensitive emulsion layer, and a third silver halide light-sensitive emulsion layer, the first silver halide emulsion layer comprising an emulsion Y having a primary spectral sensitivity in blue-sensitive region, the second silver halide emulsion layer comprising an emulsion M having a primary spectral sensitivity in green-sensitive region, the third silver halide emulsion layer comprising an emulsion C having a primary spectral sensitivity in red-sensitive region, and further comprising at least one of the first, second and third silver halide emulsion layers containing a silver halide emulsion P with a primary spectral sensitivity having a portion common to each of the primary spectral sensitivity regions of the first, second and third silver halide emulsion layers, and said color proof material has a reflective density of not less than 0.8 when measured with light at 450 nm, 550 nm or 700 nm, and said proof has a sensitivity ratio of the emulsion Y to the silver halide emulsion P within the range of 1/10 to 10 when exposed with light of a wavelength in the primary spectral sensitivity region of the emulsion Y, a sensitivity ratio of the emulsion M to the silver halide emulsion P within the range of 1/10 to 10 when exposed with light of a wavelength in the primary spectral sensitivity region of the emulsion M, or a sensitivity ratio of the emulsion C to the silver halide emulsion P within the range of 1/10 to 10 when exposed with light of a wavelength in the primary spectral sensitivity region of the emulsion C.

2. The silver halide color photographic light-sensitive material of claim 1, further comprising a compound selected from the group consisting of a water-soluble yellow dye, a water-soluble magenta dye, and a water-soluble cyan dye.

3. The silver halide color photographic light-sensitive material of claim 1, further comprising an antihalation layer.

4. The silver halide color photographic light-sensitive material of claim 3, wherein the antihalation layer is disposed as the lowermost layer on the support, and the antihalation layer contains at least one compound selected from the group consisting of water-soluble yellow dye, water-soluble magenta dye, water-soluble cyan dye and colloidal silver.

5. The silver halide color photographic light-sensitive material of claim 1, wherein, after a photographic process comprising a color developing step, the first, second and third emulsion layers have a maximum monochromatic yellow, magenta and cyan density, respectively, within the range of 1.50 to 1.90.

6. The silver halide color photographic light-sensitive material of claim 1, wherein, after a photographic process comprising a color developing step, the first, second and third emulsion layers have monochromatic yellow, magenta and cyan tones in toe portions, respectively, of not less than 1.7.

7. The silver halide color photographic light-sensitive material of claim 1, wherein the material contains a compound selected from Formula AO-I or Formula AO-II:

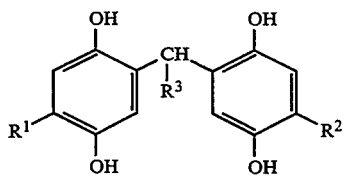

Formula [AO-I]

wherein, $R^1$ and $R^2$ individually represent a hydrogen atom, an alkyl group having not more than 8 carbon atoms, an alkoxy group, an alkylthio group or an alkylamido group, $R^3$ represents a hydrogen atom or an alkyl group having not more than 11 carbon atoms;

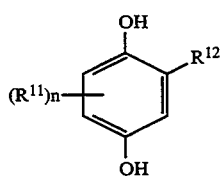

Formula [AO-II]

wherein, $R^{11}$ and $R^{12}$ individually represent a hydrogen atom or an alkyl group having not more than 5 carbon atoms, n is an integer of 1 to 3.

8. The silver halide color photographic light-sensitive material of claim 1, wherein the material contains a compound represented by Formula XI:

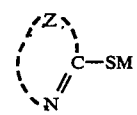

Formula XI wherein M represents a hydrogen atom, an alkali metal atom, an ammonium group or a protective group for a mercapto group, and Z represents the group consisting of non-metal atoms necessary to form a heterocyclic ring selected from the group consisting of imidazole, benzoimidazole, naphthoimidazole, thiazole, thiazoline, benzothiazole, naphthothiazole, oxazole, benzoxazole, napthoxazole, selenazole, benzoselenazole, napthoselenazole, triazole, benzotriazole, tetrazole, oxadiazole, thiadiazole, pyridine, pyrimidine, triazine, purine, and azaindene; said heterocyclic ring being unsubstituted or substituted with a substituent selected from the group consisting of halogen, hydroxyl, amino, nitro, mercapto, carboxyl, salts of carboxyl, sulfo, salts of sulfo, alkyl, alkoxy, aryl, aryloxy, alkylthio, arythio, acylamino, sulfonamido, carbamoyl and sulfamoyl.

9. The silver halide color photographic light-sensitive material of claim 1, wherein said first emulsion layer contains a yellow coupler represented by Formula Y-1:

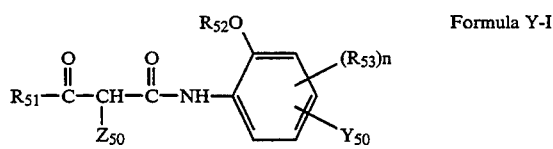

Formula Y-I wherein $R_{51}$ represents an alkyl group or a cycloalkyl group; $R_{52}$ represents an alkyl group, a cycloalkyl group, an acyl group or an aryl group; $R_{53}$ represents a group capable of being substituted to a benzene ring; n is an integer of 0 or 1; $Y_{50}$ represents a monovalent ballast group; and $Z_{50}$ represents a hydrogen atom or a group capable of splitting off when making a coupling reaction.

10. The silver halide color photographic light-sensitive material of claim 9, wherein a high boiling organic solvent is used with said magenta coupler; said high boiling solvent is represented by Formula HBS-I or HBS-II:

Formula HBS-I wherein, $R_{54}$, $R_{55}$ and $R_{56}$ individually represent an alkyl or aryl group, provided that at least two of $R_{54}$, $R_{55}$ and $R_{56}$ represent each an alkyl group having not more than 16 carbon atoms:

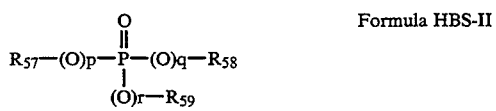

Formula HBS-II wherein, $R_{57}$, $R_{58}$ and $R_{59}$ individually represent an aliphatic or aromatic group; and p, q and r represent each an integer of 0 or 1, provided that p, q and r are not each an integer of 1 at the same time.

11. The silver halide color photographic light-sensitive material of claim 1, wherein said second emulsion layer contains a magenta coupler represented by Formula M-I:

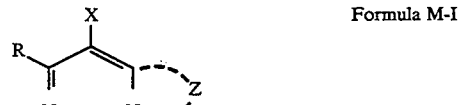

Formula M-I wherein, Z represents a group consisting of non-metal atoms necessary to form a nitrogen-containing heterocyclic ring, provided that the ring formed of the above-mentioned Z may also have a substituent, X represents a hydrogen atom or a group capable of splitting off upon making a reaction with the oxidized products of a color developing agent; and R represents a hydrogen atom or a substituent.

12. The silver halide color photographic light-sensitive material of claim 11, wherein said second emulsion layer further contains a yellow forming coupler represented by Formula Y-Ia:

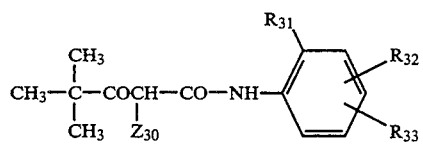

Formula Y-Ia wherein, $R_{31}$ represents a halogen atom or an alkoxy group; $R_{32}$ represents a hydrogen atom, a halogen atom or an alkoxy group that may have a substituent; $R_{33}$ represents an acylamino group, an alkoxycarbonyl group, an alkylsulfamoyl group, an arylsulfamoyl group, an arylsulfonamido group, an alkylureido group, an arylureido group, a succinimido group, an alkoxy group or an aryloxy group, $Z_{30}$ represents a hydrogen atom, a monovalent organic group capable of splitting off upon coupling with the oxidized products of a color developing agent, or a halogen atom.

13. The silver halide color photographic light-sensitive material of claim 12, wherein the difference of the pKa between said magenta forming coupler represented by Formula M-1 and said yellow forming coupler represented by Formula Y-Ia is within 2.

14. The silver halide color photographic light-sensitive material of claim 11, wherein a high boiling organic solvent is used with said yellow coupler; said high boiling solvent is represented by Formula HBS-I or Formula HBS-II:

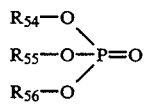

Formula HBS-I wherein, $R_{54}$, $R_{55}$ and $R_{56}$ individually represent an alkyl or aryl group, provided that at least two of $R_{54}$, $R_{55}$ and $R_{56}$ individually represent an alkyl group having not more than 16 carbon atoms,

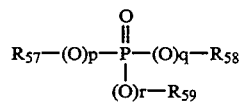

Formula HBS-II wherein, $R_{57}$, $R_{58}$ and $R_{59}$ individually represent an aliphatic or aromatic group; and p, q and r individually represent an integer of 0 or 1, provided that p, q and r are not each an integer of 1 at the same time.

15. The silver halide color photographic light-sensitive material of claim 1, further comprising at least one non-photosensitive layer; said non-photosensitive layer comprising a compound represented by Formula H-I:

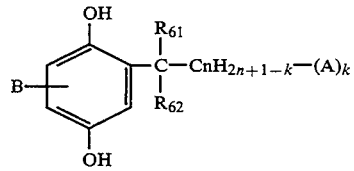

Formula H-I wherein, $R_{61}$, and $R_{62}$ individually represent an alkyl group having 1 to 5 carbon atoms; n is an integer of 1 to 20; k is an integer of 1 or 2; A represents $-CO-XR_{63}$; $-OY$; $-N(R_{64})R_{65}$; $-PO(OR_{63})-\{(O)_l R_{66}\}$ or a cyano group and B represents alkyl, alkenyl, cycloalkyl, aryl, heterocyclic or

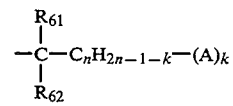

wherein X represents $-O-$ or $-N(R_{64})-$; $R_{63}$ represents a hydrogen atom, alkyl, alkenyl, cycloalkyl or aryl; $R_{64}$ represents a hydrogen atom, alkyl or aryl; Y has the same definitions as $R_{63}$ defined above; $R_{65}$ represents a hydrogen atom or alkyl, aryl or $-CO-R_{63}$ in which $R_{63}$ is defined above; l is an integer of 0 to 1; and $R_{66}$ represents a hydrogen atom, alkyl, cycloalkyl, alkenyl or aryl.

16. The silver halide color photographic light-sensitive material of claim 15 wherein $R_{61}$ and $R_{62}$ individually represent methyl, ethyl, propyl, i-propyl, butyl, sec-butyl, pentyl or neopentyl and n is an integer of 2 to 15.

17. The silver halide color photographic light-sensitive material of claim 1, wherein the first, second and third silver halide emulsion layers each contain the silver halide emulsion P.

18. A color proof preparation process comprising the steps of:

(1) exposing a silver halide positive type color proof photographic light-sensitive material with light according to the halftone dot image information color-separated into the yellow, magenta, cyan and black image information; and (2) developing said light-sensitive material, and wherein the silver halide positive color proof photographic light-sensitive material comprises a support and is provided thereon with a first silver halide light-sensitive emulsion layer, a second silver halide light-sensitive emulsion layer, and a third silver halide light-sensitive emulsion layer, the first silver halide emulsion layer comprising an emulsion Y having a primary spectral sensitivity in blue-sensitive region, the second silver halide emulsion layer comprising an emulsion M having a primary spectral sensitivity in green-sensitive region, the third silver halide emulsion layer comprising an emulsion C having a primary spectral sensitivity in red-sensitive region, and further comprising at least one of the first, second and third silver halide emulsion layers containing a silver halide emulsion P with a primary spectral sensitivity having a portion common to each of the primary spectral sensitivity regions of the first, second and third silver halide emulsion layers, and said color proof material has a reflective density of not less than 0.8 when measured with light at 450 nm, 550 nm or 700 nm, and said proof has a sensitivity ratio of the emulsion Y to the silver halide emulsion P within the range of 1/10 to 10 when exposed with light of a wavelength in the primary spectral sensitivity region of the emulsion Y, a sensitivity ratio of the emulsion M to the silver halide emulsion P within the range of 1/10 to 10 when exposed with light of a wavelength in the primary spectral sensitivity region of the emulsion M, or a sensitivity ratio of the emulsion C to the silver halide emulsion P within the range of 1/10 to 10 when exposed with light of a wavelength in the primary spectral sensitivity region of the emulsion C.

* * * * *